US011947268B2

(12) United States Patent
Zhao et al.

(10) Patent No.: US 11,947,268 B2
(45) Date of Patent: Apr. 2, 2024

(54) ENERGY CORRECTION MODULE FOR AN OPTICAL SOURCE APPARATUS

(71) Applicant: Cymer, LLC, San Diego, CA (US)

(72) Inventors: Yingbo Zhao, San Diego, CA (US); Md Hossain Toufiq Imam, San Diego, CA (US)

(73) Assignee: Cymer, LLC, San Diego, CA (US)

( * ) Notice: Subject to any disclaimer, the term of this patent is extended or adjusted under 35 U.S.C. 154(b) by 0 days.

(21) Appl. No.: 17/782,723

(22) PCT Filed: Dec. 2, 2020

(86) PCT No.: PCT/US2020/062820
§ 371 (c)(1),
(2) Date: Jun. 6, 2022

(87) PCT Pub. No.: WO2021/126527
PCT Pub. Date: Jun. 24, 2021

(65) Prior Publication Data
US 2023/0019832 A1    Jan. 19, 2023

Related U.S. Application Data

(60) Provisional application No. 63/055,563, filed on Jul. 23, 2020, provisional application No. 62/949,721, filed on Dec. 18, 2019.

(51) Int. Cl.
*G03F 7/20* (2006.01)
*G03F 7/00* (2006.01)

(52) U.S. Cl.
CPC ...... *G03F 7/70558* (2013.01); *G03F 7/70025* (2013.01); *G03F 7/70041* (2013.01);
(Continued)

(58) Field of Classification Search
CPC ............ G03F 7/70558; G03F 7/70025; G03F 7/70041; G03F 7/70308; G03F 7/70533; G03F 7/70575; G03F 7/7005
See application file for complete search history.

(56) References Cited

U.S. PATENT DOCUMENTS 5,657,334 A    8/1997  Das et al.
2003/0219094 A1  11/2003  Basting et al.
(Continued)

FOREIGN PATENT DOCUMENTS

DE    102014221173 A1    4/2016
JP    H0758393 A          3/1995
(Continued)

OTHER PUBLICATIONS

Jens Weckesser, European International Searching Authority, International Search Report and Written Opinion, counterpart PCT Application No. PCT/US2020/062820, dated Jun. 2, 2021, 15 pages total.
(Continued)

*Primary Examiner* — Mesfin T Asfaw
(74) *Attorney, Agent, or Firm* — DiBerardino McGovern IP Group LLC

(57) ABSTRACT

A system for deep ultraviolet (DUV) optical lithography includes an optical source apparatus including N optical oscillators, N being an integer number greater than or equal to two, and each of the N optical oscillators is configured to produce a pulse of light in response to an excitation signal; and a control system coupled to the optical source apparatus. The control system is configured to determine a corrected excitation signal for a first one of the N optical oscillators based on an input signal, the input signal including an energy property of a pulse of light produced by another one of the N optical oscillators.

20 Claims, 24 Drawing Sheets

(52) U.S. Cl.
CPC ...... *G03F 7/70308* (2013.01); *G03F 7/70533* (2013.01); *G03F 7/70575* (2013.01)

(56) References Cited

U.S. PATENT DOCUMENTS

| | | |
|---|---|---|
| 2008/0036991 A1 | 2/2008 | Heintze et al. |
| 2017/0093119 A1 | 3/2017 | Suzuki et al. |
| 2018/0191124 A1 | 7/2018 | Umeda et al. |

FOREIGN PATENT DOCUMENTS

| | | |
|---|---|---|
| JP | H09232659 A | 9/1997 |
| JP | 2005252147 A | 9/2005 |
| JP | 2008047897 A | 2/2008 |
| WO | 2016058826 A1 | 4/2016 |

OTHER PUBLICATIONS

Office Action, counterpart Japanese Patent Application No. 2022-528595 dated Jul. 11, 2023, 11 pages total (including English translation of 6 pages).

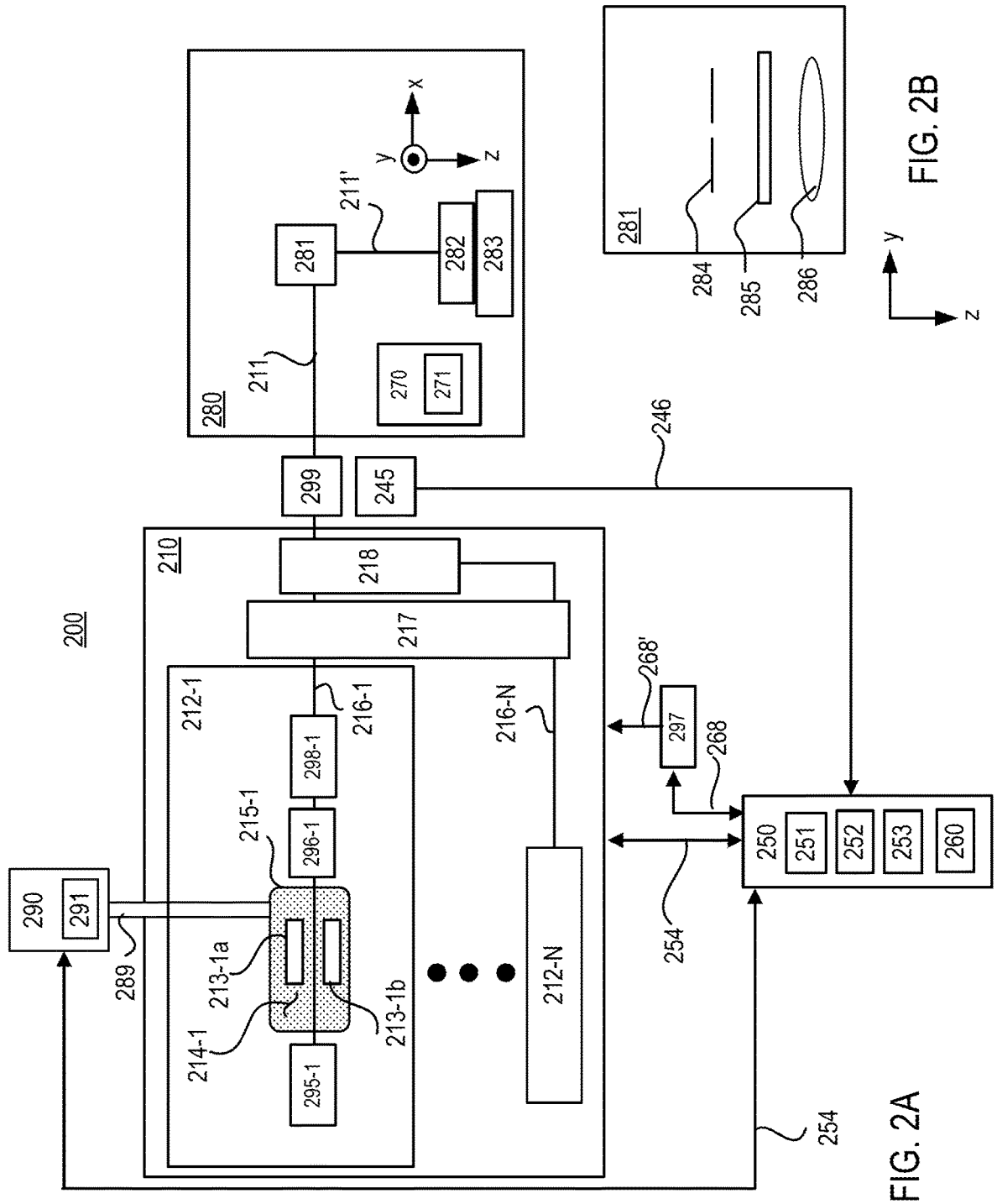

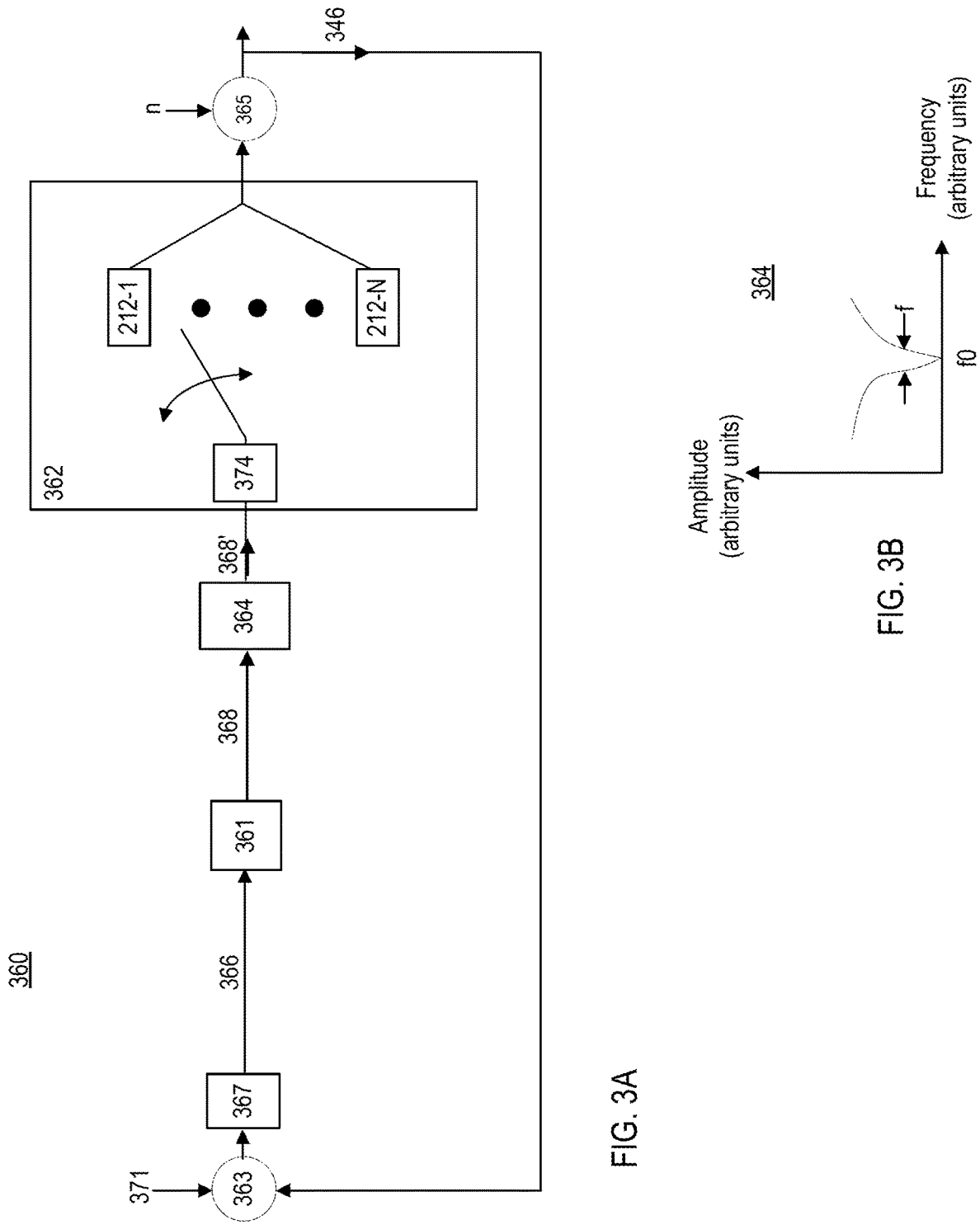

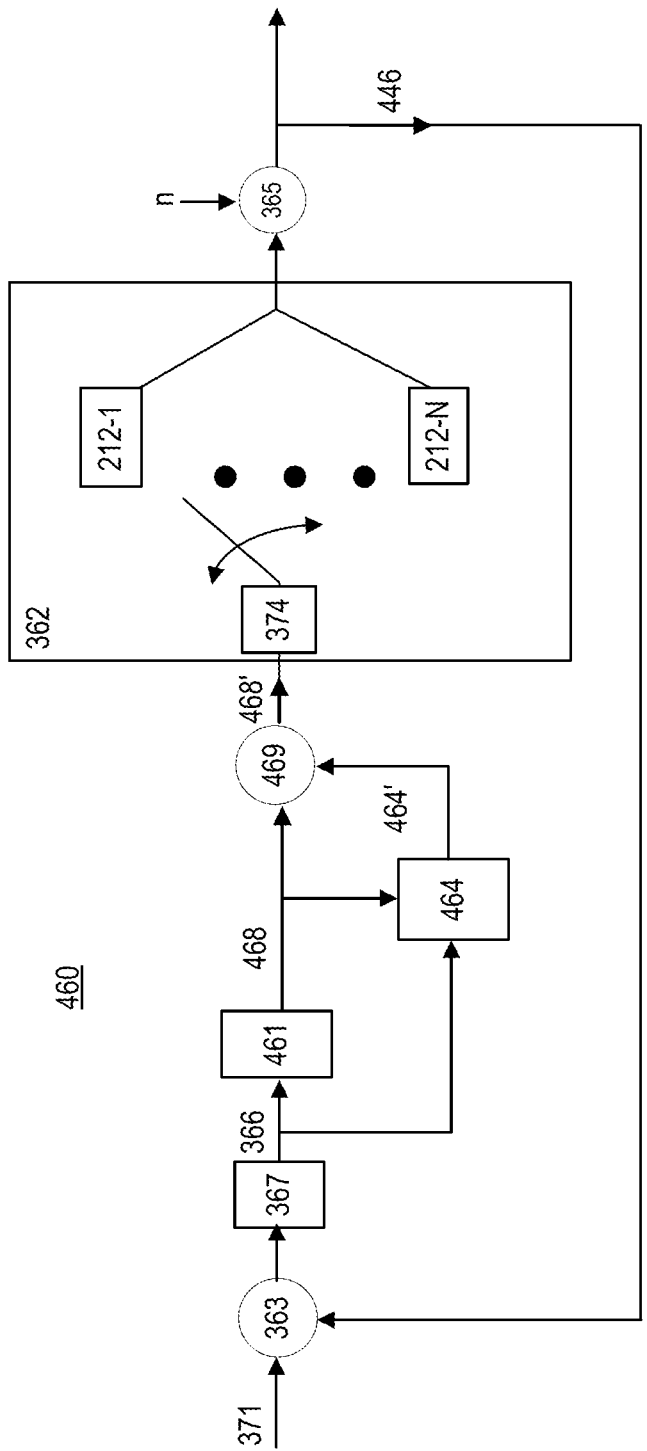
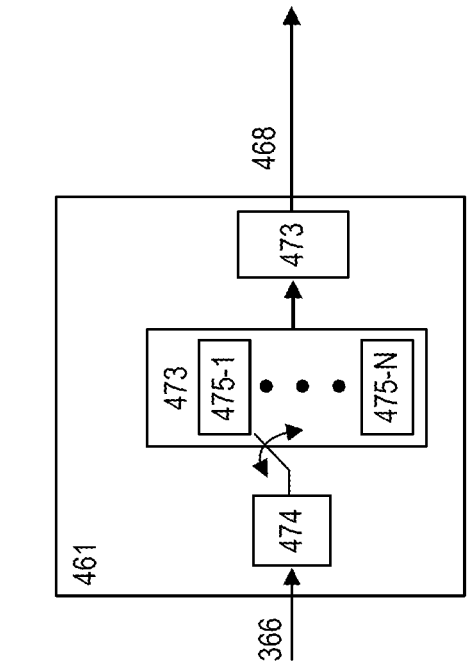
FIG. 4A
FIG. 4B

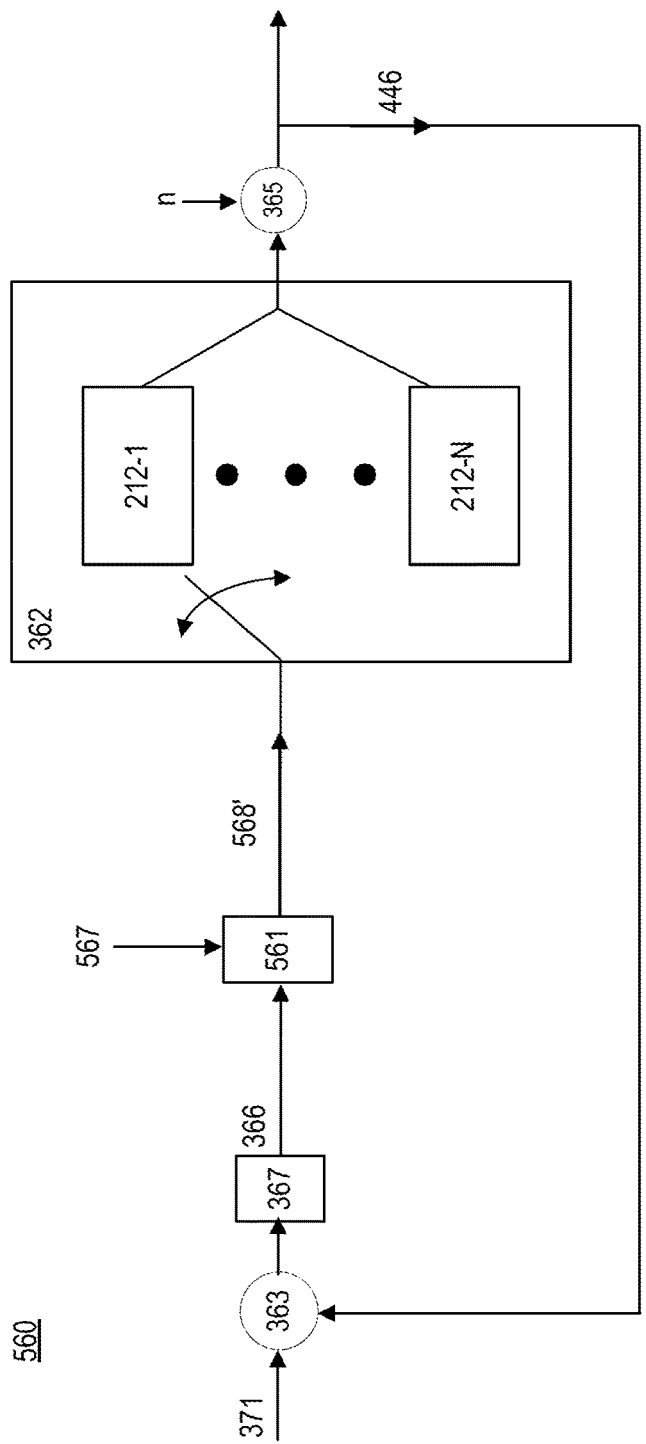
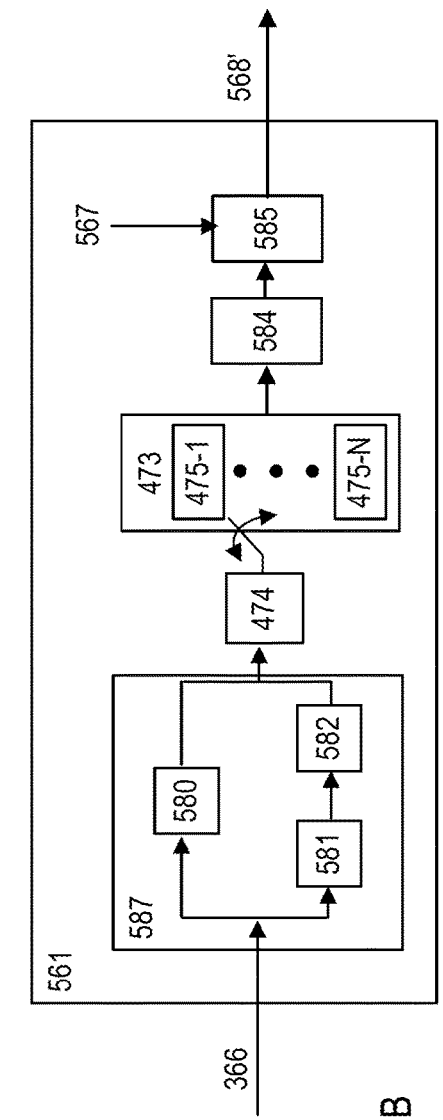
FIG. 5A
FIG. 5B

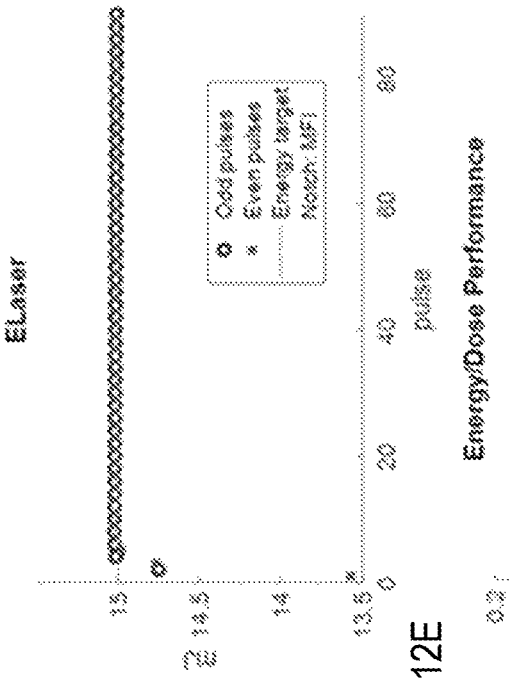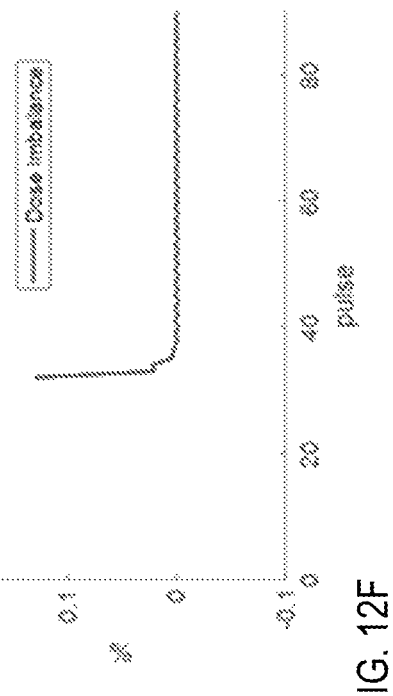
FIG. 12C
FIG. 12E
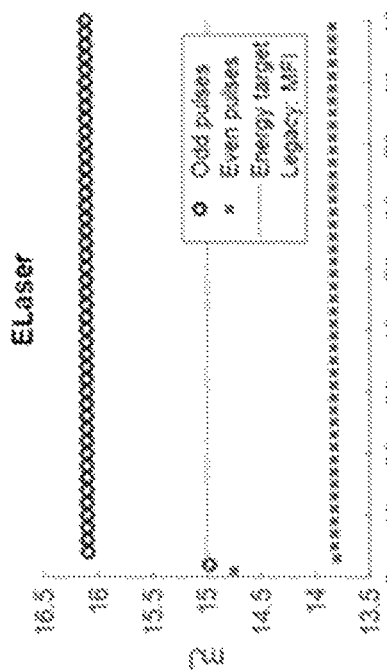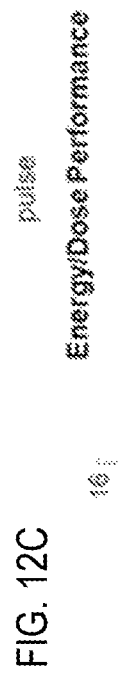
FIG. 12D
FIG. 12F

ENERGY CORRECTION MODULE FOR AN OPTICAL SOURCE APPARATUS

CROSS REFERENCE TO RELATED APPLICATIONS

This application claims priority to U.S. Application No. 62/949,721, filed Dec. 18, 2019, titled ENERGY CORRECTION MODULE FOR AN OPTICAL SOURCE APPARATUS; and U.S. Application No. 63/055,563, filed Jul. 23, 2020, titled ENERGY CORRECTION MODULE FOR AN OPTICAL SOURCE APPARATUS, both of which are incorporated herein in their entireties by reference.

TECHNICAL FIELD

This disclosure relates to an energy correction module for an optical source apparatus. The optical source apparatus includes a plurality of optical oscillators, each of which may produce a deep ultraviolet (DUV) light beam.

BACKGROUND

Photolithography is the process by which semiconductor circuitry is patterned on a substrate such as a silicon wafer. An optical source generates deep ultraviolet (DUV) light used to expose a photoresist on the wafer. DUV light may include wavelengths from, for example, about 100 nanometers (nm) to about 400 nm. Often, the optical source is a laser source (for example, an excimer laser) and the DUV light is a pulsed laser beam. The DUV light from the optical source interacts with a projection optical system, which projects the beam through a mask onto the photoresist on the silicon wafer. In this way, a layer of chip design is patterned onto the photoresist. The photoresist and wafer are subsequently etched and cleaned, and then the photolithography process repeats.

SUMMARY

In one aspect, a system for deep ultraviolet (DUV) optical lithography includes an optical source apparatus including N optical oscillators, N being an integer number greater than or equal to two, and each of the N optical oscillators is configured to produce a pulse of light in response to an excitation signal; and a control system coupled to the optical source apparatus. The control system is configured to determine a corrected excitation signal for a first one of the N optical oscillators based on an input signal, the input signal including an energy property of a pulse of light produced by another one of the N optical oscillators.

Implementations may include one or more of the following features.

The control system may be configured to apply a filter to the input signal to produce a filtered input signal. The filter may be a notch filter that transmits information having a frequency in a first frequency band and substantially blocks information having a frequency outside the first frequency band. The optical source apparatus may produce an exposure light beam, each of the N optical oscillators may emit a pulse of light at a repetition rate, all of the N optical oscillators may have the same repetition rate, and the exposure light beam may include pulses of light from each of the N optical oscillators separated in time from each other. The filter may produce an output based on the input signal and an energy error value, and the control system may be configured to determine the corrected input signal based on the output of the filter and the initial input signal. The filter may be a Kalman filter. The control system also may be configured to apply a feed-forward correction to the initial input signal prior to determining the corrected input signal. The feed-forward correction signal may be determined based on a first modelled relationship between an energy of a produced pulse of light and an excitation quantity for the first one of the N optical amplifiers and a second modelled relationship between an energy of a produced pulse of light and an excitation quantity for the second one of the N optical amplifiers. The excitation mechanism in each of the N optical oscillators may include a set of electrodes, the first modelled relationship may be a linear relationship that relates an amount of voltage applied to the electrodes in the first one of the N optical amplifiers to the energy of the produced pulse of light, and the second modelled relationship may be a linear relationship that relates an amount of voltage applied to the electrodes in the first one of the N optical amplifiers to the energy of the produced pulse of light.

The system also may include a scanner apparatus configured to receive an exposure light beam from the optical source apparatus. The control system may be implemented as part of the scanner apparatus such that the scanner apparatus provides the corrected excitation signal to the first one of the N optical oscillators. The energy property may include a metric based on an optical energy measurement obtained in the scanner apparatus.

The system also may include a beam combiner configured to: receive pulses of light from any of the N optical oscillators and to direct the received pulses of light toward a scanner apparatus as an exposure light beam.

The energy property may be an energy error.

The pulse of light produced by the other one of the N optical oscillators may be a first pulse of light in an exposure light beam, the pulse of light formed by the first one of the N optical oscillators in response to application of the excitation signal is a second pulse in the exposure light beam, and the second pulse and the first pulse may be consecutive pulses.

In another aspect, method for a deep ultraviolet (DUV) optical lithography system includes: determining an energy error based on an amount of energy in a pulse of light emitted from a first one of N optical oscillators and received by a scanner apparatus, N being an integer number that is equal to or greater than two, and the energy error is a difference between the amount of energy in the pulse of light and a target energy; receiving an initial input signal, the initial input signal being based on the energy error; determining a corrected input signal based on the initial input signal; and applying the corrected input signal to an excitation mechanism of a second one of the N optical oscillators.

Implementations may include one or more of the following features.

Determining the corrected input signal based on the initial input signal may include filtering the initial input signal. Filtering the initial input signal may include applying a notch filter to the initial input signal. Filtering the initial input signal may include providing the initial input signal and the energy error to a Kalman filter. Filtering the initial input signal may include applying a feed-forward correction to the initial input signal. The initial input signal may be received from a scanner apparatus configured to receive an exposure light beam generated by more than one of the N optical oscillators.

In another aspect, a system includes: an optical source apparatus including: an optical oscillator configured to produce a pulse of light in response to an excitation signal; and a spectral adjustment apparatus configured to control a spectral property of the pulse of light; and a control system coupled to the optical source apparatus, the control system configured to determine a corrected excitation signal that adjusts an energy of a subsequently produced pulse of light to account for a change in the configuration of the spectral adjustment apparatus.

Implementations may include one or more of the following features. The optical oscillator may be associated with a plurality of transfer functions, each transfer function being associated with a particular configuration of the spectral adjustment apparatus, and the control system may be configured to determine the corrected excitation signal based on the transfer function associated with the particular configuration of the spectral adjustment apparatus used to produce the subsequent pulse of light. The spectral adjustment apparatus may include at least one prism, and each transfer function may be associated with a different position of the at least one prism. The spectral property may be a center wavelength of the pulse of light.

Each configuration of the spectral adjustment apparatus may be associated with a particular value of the spectral property. Each configuration of the spectral adjustment apparatus may be associated with a particular value of a center wavelength and a bandwidth of the pulse of light.

The optical source apparatus also may include a power amplifier that receives a seed light beam from the optical oscillator, and the system may be configured for use in a deep ultraviolet (DUV) lithography system.

In another aspect, a method includes: providing a first excitation signal to an optical oscillator associated with a spectral adjustment apparatus in a first configuration state to generate a first pulse of light having a first value of a spectral property; adjusting the spectral adjustment apparatus to a second configuration state; determining a corrected excitation signal based on an energy property of the first pulse of light and a transfer function of the optical oscillator when the spectral adjustment apparatus is in the second configuration state; and providing the corrected excitation signal to the optical oscillator while the spectral adjustment apparatus is in the second configuration state to generate a second pulse of light having a second value of the spectral property.

Implementations may include one or more of the following features. The second pulse of light may have a second value of the energy property, and the second value may be substantially equal to the first value of the energy property.

In another aspect, a method of controlling an optical source apparatus to generate a pulsed light beam that has at least two spectral peaks separated by a spectral distance, the method including: generating a first pulse of light from the optical source apparatus, the first pulse of light having a first wavelength and a first value of an energy property; adjusting at least one component of the optical source apparatus, the at least one component being configured to control a spectral property of light emitted from the optical source apparatus; determining a corrected excitation signal; and applying the corrected excitation signal to the optical source apparatus after adjusting the at least one component to generate a second pulse of light from the optical source apparatus, the second pulse of light having a second wavelength and the first value of the energy property. The pulsed light beam includes at least the first pulse of light and the second pulse of light, and the spectral distance is a difference between the first wavelength and the second wavelength.

Implementations may include one or more of the following features. The optical source apparatus may have only one optical oscillator, and adjusting the at least one component of the optical source apparatus may include adjusting a spectral adjustment apparatus of the one optical oscillator from a first configuration state to a second configuration state; the one optical oscillator may be associated with a plurality of transfer functions, each of the transfer functions corresponding to a particular configuration state of the spectral adjustment apparatus; and the corrected excitation signal may be determined based on the transfer function that corresponds to the second configuration state of the spectral adjustment apparatus. Adjusting the spectral adjustment apparatus may include actuating a dispersive optical element.

The optical source apparatus may include N optical oscillators, each associated with a transfer function that relates excitation energy and produced energy, and a first one of the N optical oscillators produces the first pulse of light; adjusting the at least one component of the optical source apparatus may include switching from the first one of the N optical oscillators to a second one of the N optical oscillators such that the second one of the N optical oscillators produces the second pulse of light; and the corrected excitation signal may be determined based on the transfer function of the second one of the N optical oscillators.

In another aspect, a control module for an optical source apparatus, the control module configured to: cause the optical source apparatus to generate a first pulse of light from the optical source apparatus, the first pulse of light having a first wavelength and a first value of an energy property; adjust at least one component of the optical source apparatus, the at least one component being configured to control a spectral property of light emitted from the optical source apparatus; determine a corrected excitation signal; and apply the corrected excitation signal to the optical source apparatus after the at least one component to generate a second pulse of light from the optical source apparatus is adjusted, the second pulse of light having a second wavelength and the first value of the energy property. The pulsed light beam includes at least the first pulse of light and the second pulse of light, and the spectral distance is a difference between the first wavelength and the second wavelength.

Implementations of any of the techniques described above and herein may include a process, an apparatus, a control system, instructions stored on a non-transient machine-readable computer medium, and/or a method. The details of one or more implementations are set forth in the accompanying drawings and the description below. Other features will be apparent from the description and drawings, and from the claims.

BRIEF DESCRIPTION OF THE DRAWINGS

FIG. 2A is a block diagram of a system that includes another example of an optical source apparatus and an example of a scanner apparatus.

FIG. 2B is a block diagram of an example of a projection optical system that may be used in the scanner apparatus of FIG. 2A.

FIG. 3A is a block diagram of another example of an energy control module.

FIG. 3B is an illustration of a frequency response of an example of a notch filter.

FIG. 4A is a block diagram of another example of an energy control module.

FIG. 4B is a block diagram of an example of an excitation determination module that may be used in the energy control module of FIG. 4A.

FIG. 5A is a block diagram of another example of an energy control module.

FIG. 5B is a block diagram of an example of an excitation determination module that may be used in the energy control module of FIG. 5A.

FIGS. 12C-12F are examples of simulated data.

DETAILED DESCRIPTION

A control system for correcting an excitation signal provided to an optical source apparatus is disclosed. The control system may be used with any type of optical source apparatus. For example, the control system may be used with an optical source apparatus that includes a plurality of optical oscillators, each of which is configured to emit pulses of light toward a common optical element or system. The control system may be used with an optical source apparatus that includes a single optical oscillator. The control system may be used with a multi-stage optical source that includes one or more optical oscillators and one or more power amplifiers.

Figure 1A:
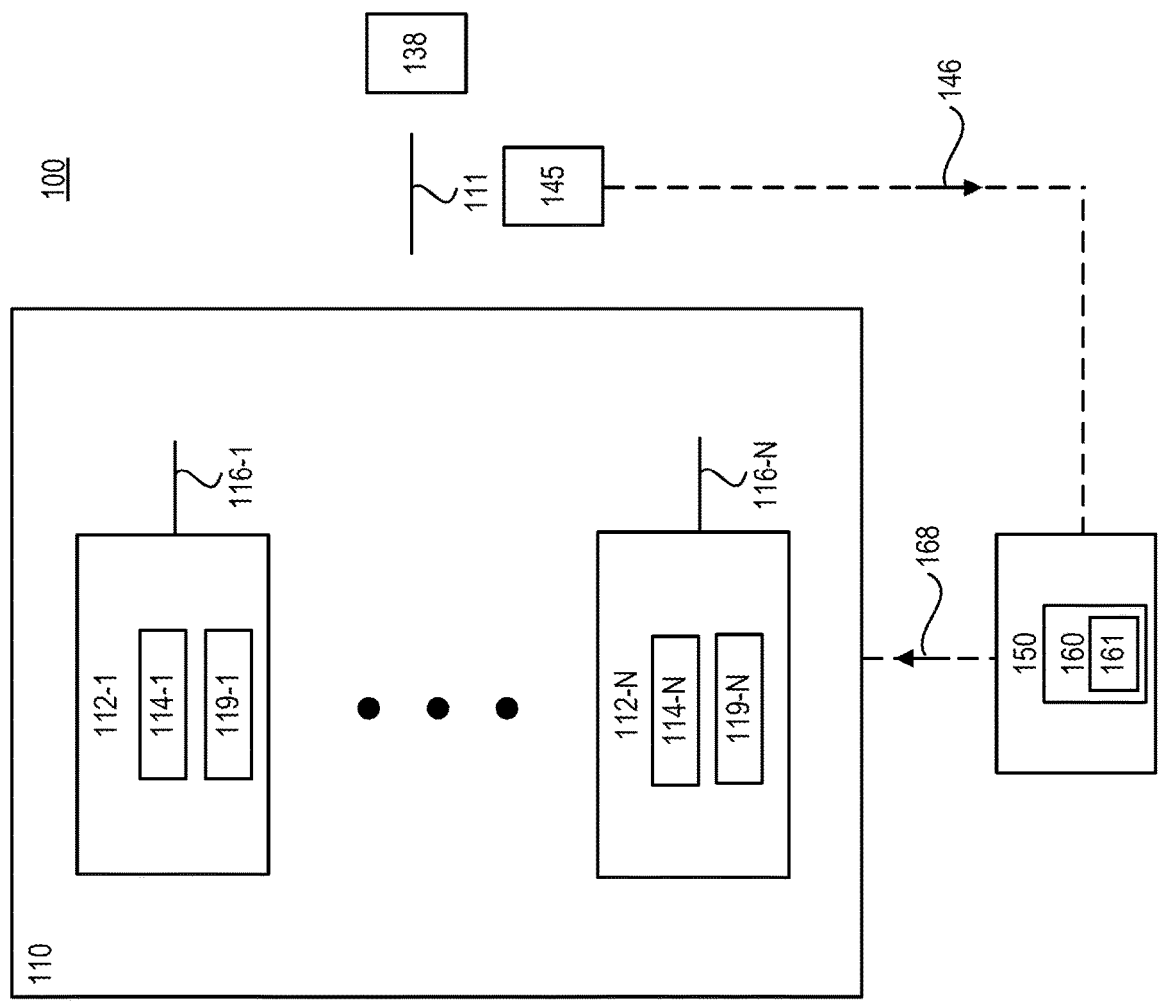
FIG. 1A is a block diagram of a system that includes an example of an optical source apparatus.

Referring to FIG. 1A, a block diagram of a system 100 is shown. The system 100 includes an optical source apparatus 110 and a control system 150. The optical source apparatus 110 provides a pulsed output light beam 111 to a common optical element 138. The common optical element 138 may be, for example, a beam combiner (such as the beam combiner 218 in FIG. 2A), an optical subsystem or detection system, or a lithography tool (such as the scanner apparatus 280 in FIG. 2A). The optical source apparatus 110 includes N optical oscillators 112-1 to 112-N, where N is an integer number greater than one. Each of the N optical oscillators 112-1 to 112-N includes a respective gain medium 114-1 to 114-N. Pulsed light beams 116-1 to 116-N are generated by repeatedly exciting the respective gain medium 114-1 to 114-N. Pulses from one or more of the optical oscillators 112-1 to 112-N make up the output light beam 111. The system 100 also includes an optical detection system 145, which is configured to sense light and to produce an energy property signal 146. The energy property signal 146 includes information related to an energy property of the sensed light. The energy property may be, for example, an optical energy of an optical pulse in the output light beam 111 or an energy error associated with an optical pulse in the output light beam 111.

The control system 150 includes an energy control module 160 that generates an excitation signal 168, or causes the excitation signal 168 to be generated by a separate device (such as the voltage source 297 of FIG. 2A). When the excitation signal 168 is applied to one of the optical oscillators 112-1 to 112-N, that optical oscillator generates a pulse of light. The excitation signal 168 and the pulses in the output light beam 111 are time-varying signals. In the discussion below, individual instances of the excitation signal 168, the pulses, and the energy property signal 146 may be indexed by k, where k is an integer number. For example, the kth instance of the excitation signal 168 (the excitation signal 168(k)) produces pulse k of the output light beam 111. The energy control module 160 receives an instance of the energy property signal 146 and generates an instance of the excitation signal 168 for each pulse in the output light beam 111.

The amount of optical energy produced in response to the application of the excitation signal 168 depends on the characteristics of the excitation signal 168. For example, the excitation signal 168 may be a train of voltage pulses, and the characteristics of the excitation signal 168 may include an amplitude and/or temporal duration of the voltage pulses. The energy control module 160 includes an excitation determination module 161 that determines the excitation signal 168 or characteristics of the excitation signal 168. In the discussion below, the excitation determination module 161 and its various implementations are described as generating or determining the excitation signal 168. However, in some implementations, the excitation determination module 161 (or any of its various implementations) generates characteristics of the signal 168 that are provided to another apparatus that generates the signal 168 based on the characteristics. For example, the excitation signal 168 may be a high-voltage signal that is generated by a separate high-voltage source based on characteristics provided by the excitation determination module 161.

Figure 1B:
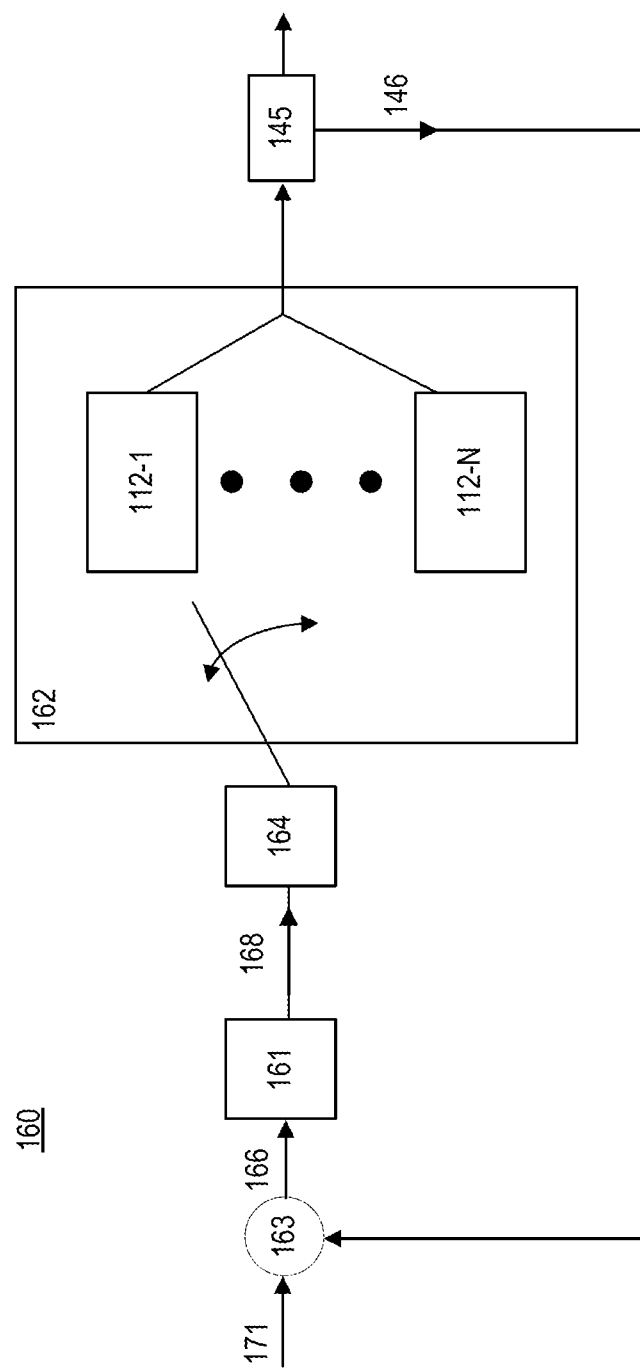
FIG. 1B is a block diagram of an example of an energy control module.

A block diagram of an example of the energy control module 160 is shown in FIG. 1B. The energy control module 160 includes a comparator 163, the excitation determination module 161, a correction module 164, and an oscillator selection module 162. The comparator 163 determines an error signal 166, which is a difference between the energy property signal 146 and a target energy 171 (also referred to as Etarget). The target energy 171 is a pre-defined optical energy that is associated with acceptable or optimal performance of the system 100. The excitation determination module 161 determines the excitation signal 168 based on the error signal 166. The correction module 164 corrects the excitation signal 168 to account for differences in the optical oscillators 112-1 to 112-N, as discussed further below. The oscillator selection module 162 determines to which of the oscillators 112-1 to 112-N the excitation signal 168 is applied.

Figure 1C:
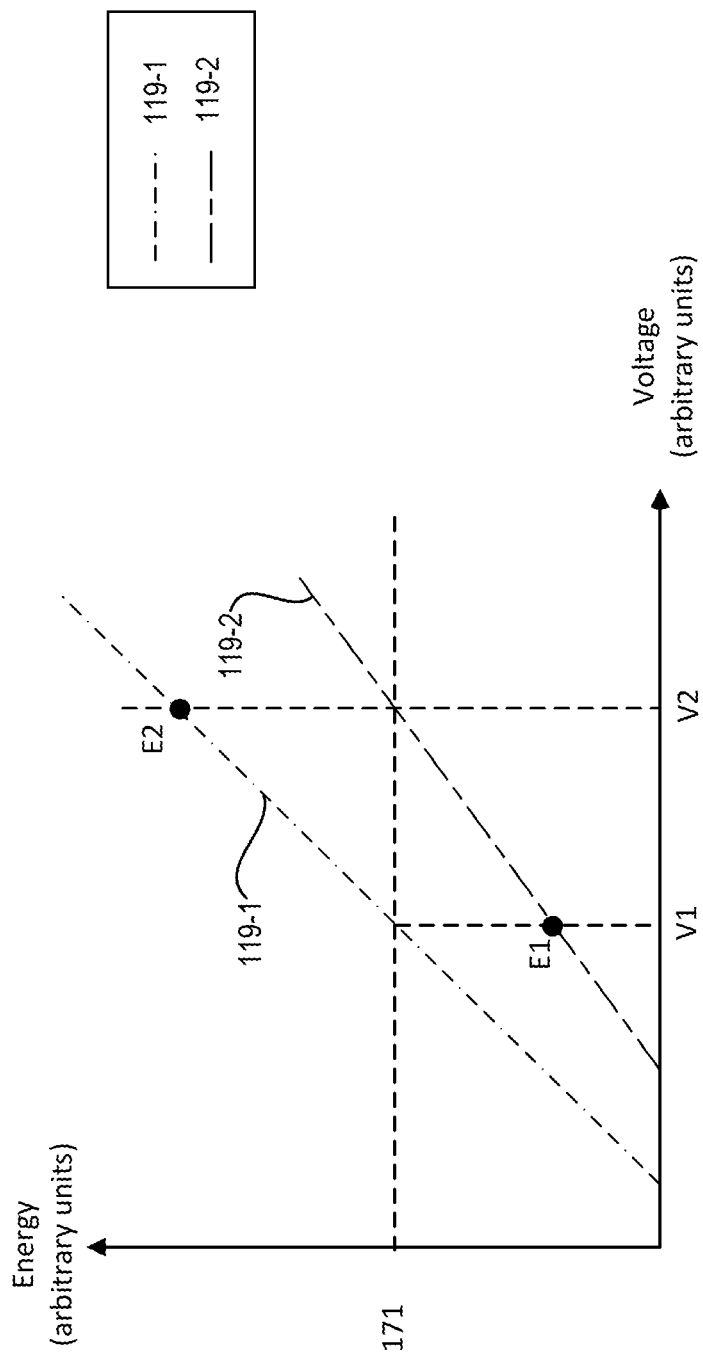
FIG. 1C is an illustration of examples of transfer functions.

Referring again to FIG. 1A, each of the optical oscillators 112-1 to 112-N has a respective efficiency characteristic or transfer function 119-1 to 119-N. Each transfer function 119-1 to 119-N relates characteristics of the excitation signal 168 to an amount of optical output produced by the respective optical oscillator 112-1 to 112-N. Due to differences in hardware and configuration of the optical oscillators 112-1 to 112-N and/or the composition, pressure, temperature, and/or density of the gain mediums 114-1 to 114-N, the transfer functions 119-1 to 119-N are generally not identical. FIG. 1C illustrates transfer functions 119-1 and 119-2. The transfer functions 119-1 and 119-2 are examples of transfer functions that may be associated with the optical oscillators 112-1 and 112-2, respectively. In the example of FIG. 1C, the transfer functions 119-1 and 119-2 relate an amount of voltage applied to the electrodes of a gaseous gain medium to the optical energy produced by the gain medium in response. As shown in FIG. 1C, the transfer functions 119-1 and 119-2 are not the same.

The examples discussed with respect to FIGS. 1C-1G relate to a scenario that uses a legacy control system that does not include the energy control module 160. Further, the examples discussed with respect to FIGS. 1C-1G relate to an implementation in which every other pulse of the output light beam 111 is produced by the optical oscillator 112-1 and the remaining pulses of the output light beam 111 are produced by the optical oscillator 112-2. In other words, if the pulse k−1 is produced by the optical oscillator 112-1, the pulse k is produced by the optical oscillator 112-2. An operating mode in which every other pulse k is produced by a different one of the N optical oscillators may be referred to as a "tic-tok" mode.

Figures 1D, 1E, 1F, 1G:
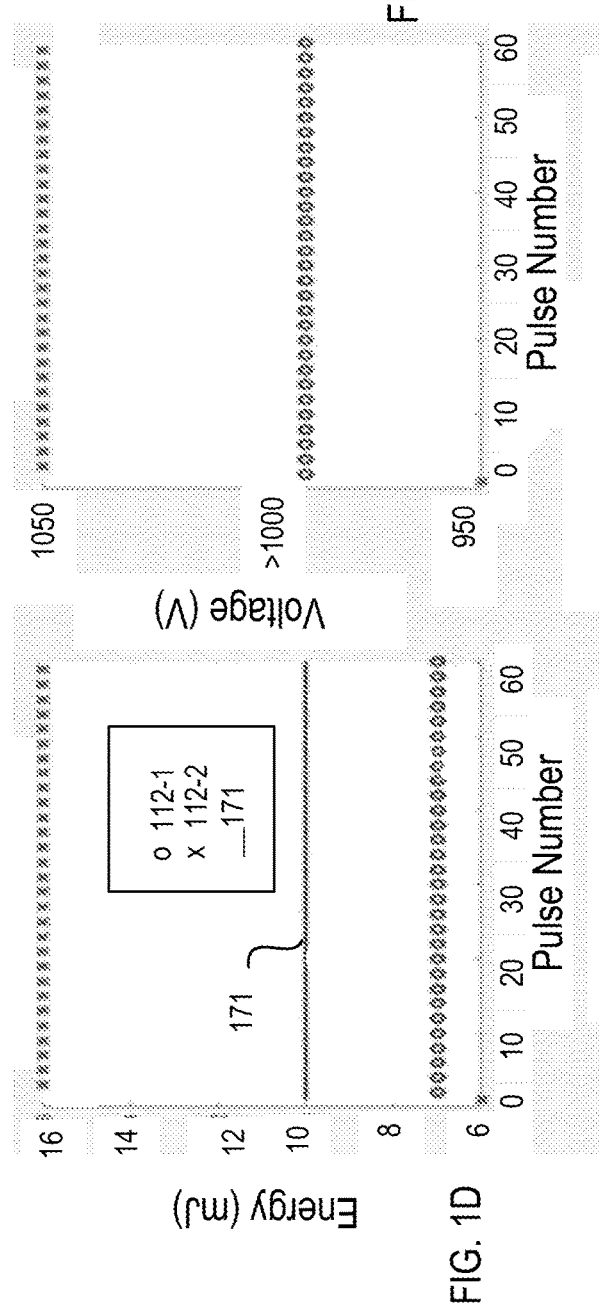
FIGS. 1D-1G are plots of various data features optical pulses.

Referring to FIG. 1C, the voltage V1 is the voltage applied to the gain medium 114-1 to produce a pulse of light k. The energy of the pulse k is measured and provided to a legacy control system, which determines the energy error for the pulse k based on the measured energy and a target energy, Etarget 171. The legacy control system determines a voltage V2 that, if applied to the gain medium 114-1, would produce a pulse k that has an energy of Etarget 171. However, because the voltage is applied to the optical oscillator 112-2 instead of the optical oscillator 112-1, the optical energy of the pulse k is E2, which is not Etarget 171. Instead of remaining at or near Etarget 171, the optical energy of the pulses of the output light beam 111 oscillates between the optical energy produced by the optical oscillator 112-1 and the optical energy produced by the optical oscillator 112-2. This is shown in FIG. 1D, which is a plot of the output energy 146 of the output light beam 111 as a function of pulse number k in a situation in which a legacy control system that does not include the energy control module 160 is used. The energy of pulses produced by the optical oscillator 112-1 is shown with circle symbols. The energy of pulses produced by the optical oscillator 112-2 is shown with "x" symbols. FIG. 1E shows the voltage amplitude of the excitation signal as a function of pulse number k. FIG. 1F shows the energy error of the pulses in the output light beam 111 as a function of pulse number k. FIG. 1G shows the dose error (percentage) as a function of the pulse number k. The dose is the amount of optical energy that the output light beam 111 delivers per unit area over an exposure time or a particular number of pulses. The dose error is the difference between a desired or target dose and the actual dose. The performance of the system 100 is improved when the dose error is minimized. The dose error values for pulse numbers 1 to 39 are not shown on FIG. 1G.

As shown in FIGS. 1D, 1F, and 1G, the pulse energy, the energy error, and the dose error oscillate. The oscillations are energy disturbances due to the differences in the transfer functions 119-1 and 119-2 and the lack of a correction mechanism that accounts for those differences in the legacy control system. The frequency of the oscillations depends on the frequency at which the control system samples the output light beam 111. In the example discussed with respect to FIGS. 1C-1G, the control system samples the output light beam 111 at each pulse, and the oscillations have a frequency equal to the Nyquist frequency of the control system (which is half of the repetition rate of the output light beam 111).

Accordingly, without correction, the discrepancy between the transfer function 119-1 and the transfer function 119-2 may cause erroneous or non-optimal results. One possible approach to addressing the variable nature of the transfer functions 119-1 to 119-N is to implement a separate instance of the excitation determination module 161 for each of the N optical oscillators. However, such an approach increases costs and complexity, and may become unwieldy as N increases. On the other hand, the control system 150 includes the energy control module 160, which corrects the excitation signal 168 using the correction module 164 and a modeling module that estimates the transfer function of the optical oscillators. The energy control module 160 removes or reduces energy disturbances such as the ones shown in FIGS. 1D, 1F, and 1G.

Prior to discussing various implementations and examples of the energy control module 160, an overview of one possible implementation of the optical source apparatus 110 is provided with respect to FIGS. 2A and 2B.

Referring to FIGS. 2A and 2B, a system 200 includes an optical source apparatus 210 that provides an exposure light beam (or output light beam) 211 to a scanner apparatus 280. A control system 250 is coupled to the optical source apparatus 210 and various components associated with the optical source apparatus 210 via a data connection 254. The data connection 254 is any type of wireless and/or wired medium that carries data and information as, for example, electrical or optical signals. The optical source apparatus 210 and the control system 250 are implementations of the optical source apparatus 110 and control system 150, respectively (FIG. 1).

The control system 250 implements an energy control module 260. The energy control module 260 generates an excitation signal 268 based on an energy property signal 246. The energy property signal 246 is produced by an optical detection system 245. The optical detection system 245 is any type of optical sensor or detector that is capable of measuring optical energy in the exposure light beam 211 and producing the energy property signal 246. The energy property signal 246 includes information about the energy in one or more pulses of the exposure light beam 211.

The optical source apparatus 210 includes optical oscillators 212-1 to 212-N, where N is an integer number that is greater than one. Each optical oscillator 212-1 to 212-N generates a respective light beam 216-1 to 216-N. The details of the optical oscillator 212-1 are discussed below. The other N−1 optical oscillators in the optical source apparatus 210 include the same or similar features.

The optical oscillator 212-1 includes a discharge chamber 215-1, which encloses a cathode 213-1a and an anode 213-1b. The discharge chamber 215-1 also contains a gaseous gain medium 214-1. A potential difference between the cathode 213-1a and the anode 213-1b forms an electric field in the gaseous gain medium 214-1. The potential difference may be generated by controlling a voltage source 297 to apply voltage to the cathode 213-1a and/or the anode 213-1b. In the example of FIG. 2A, the voltage source 297 is controlled by the excitation signal 268. The excitation signal 268 includes information sufficient to cause the voltage source 297 to produce a voltage signal 268' and to apply the voltage signal 268' to a particular one or ones of the optical oscillators 212-1 to 212-N. The voltage signal 268' has an amplitude that is specified by the excitation signal 268. The voltage source 297 applies the voltage signal 268' to apply a voltage of a particular amplitude to the electrodes of the one or ones of the optical oscillators 212-1 to 212-N that are to produce the next pulse. For example, the voltage signal 268' is applied to the cathode 213-1a and/or the anode 213-1b if the optical oscillator 212-1 is to produce the next pulse. The electric field provides energy to the gain medium 214-1 sufficient to cause a population inversion and to enable generation of a pulse of light via stimulated emission. Repeated creation of such a potential difference forms a train of pulses, which are emitted as the light beam 216-1.

The duration and repetition rate of the pulses in the pulsed light beam 216-1 is determined by the duration and repetition rate of the application of the voltage to the electrodes 213-1a and 213-1b. The repetition rate of the pulses may range, for example, between about 500 and 6,000 Hz. In some implementations, the repetition rate may be greater than 6,000 Hz, and may be, for example, 12,000 Hz or greater. Each pulse emitted from the optical oscillator 212-1 may have a pulse energy of, for example, approximately 1 milliJoule (mJ). The exposure light beam 211 can include one or more bursts that are separated from each other in time. Each burst can include one or more pulses of light. In some implementations, a burst includes hundreds of pulses, for example, 100-400 pulses. The temporal separation between two bursts is greater than the temporal separation between two pulses.

The gaseous gain medium 214-1 may be any gas suitable for producing a light beam at the wavelength, energy, and bandwidth required for the application. The gaseous gain medium 214-1 may include more than one type of gas, and the various gases are referred to as gas components. For an excimer source, the gaseous gain medium 214-1 may contain a noble gas (rare gas) such as, for example, argon or krypton; or a halogen, such as, for example, fluorine or chlorine. In implementations in which the gain medium includes a halogen, the gain medium may also include a buffer gas such as helium and traces of xenon.

The gaseous gain medium 214-1 may be a gain medium that emits light in the deep ultraviolet (DUV) range. DUV light may include wavelengths from, for example, about 100 nanometers (nm) to about 400 nm. Specific examples of the gaseous gain medium 214-1 include argon fluoride (ArF), which emits light at a wavelength of about 193 nm, krypton fluoride (KrF), which emits light at a wavelength of about 248 nm, or xenon chloride (XeCl), which emits light at a wavelength of about 351 nm.

A resonator is formed between a spectral adjustment apparatus 295-1 on one side of the discharge chamber 215-1 and an output coupler 296-1 on a second side of the discharge chamber 215-1. The spectral adjustment apparatus 295-1 may include a diffractive optic such as, for example, a grating and/or a prism, that finely tunes the spectral output of the discharge chamber 215-1. The diffractive optic may be reflective or refractive. In some implementations, the spectral adjustment apparatus 295-1 includes a plurality of diffractive optical elements. For example, the spectral adjustment apparatus 295-1 may include four prisms, some of which are configured to control a center wavelength of the light beam 216-1 and others of which are configured to control a spectral bandwidth of the light beam 216-1.

The optical oscillator 212-1 also includes a spectral analysis apparatus 298-1. The spectral analysis apparatus 298-1 is a measurement system that may be used to measure or monitor the wavelength of the light beam 216-1. In the example shown in FIG. 2A, the spectral analysis apparatus 298-1 receives light from the output coupler 296-1. Other implementations are possible. For example, the spectral analysis apparatus 298-1 may be between the output coupler 296-1 and the spectral adjustment apparatus 295-1 or may be positioned in the scanner apparatus 280.

In some implementations, the spectral analysis apparatus 298-1 provides data to the control system 250. In these implementations, the control system 250 may determine metrics related to the spectral characteristics of the light beam 216-1 based on the data from the spectral analysis apparatus 298-1. For example, the control system 250 may determine a center wavelength and/or a spectral bandwidth based on the data measured by the spectral analysis apparatus 298-1. The spectral property may be measured by the apparatus 298-1 directly or may be determined by the control system 250 based on data from the spectral analysis apparatus 298-1. The center wavelength is the power-weighted average wavelength of the light beam. Spectral bandwidth is a measure of the spread or distribution of wavelengths in a light beam. The spectral bandwidth may be characterized by a quantity such as the full-width at half max (FWHM) or the 95% integral width (E95). The FWHM is the spectral range encompassed at half of the maximum intensity. E95 is the interval that encloses 95% of the total energy in the spectrum.

The optical source apparatus 210 also includes a gas supply system 290 that is fluidly coupled to an interior of the discharge chamber 215-1 via a fluid conduit 289. The fluid conduit 289 is any conduit that is capable of transporting a gas or other fluid with no or minimal loss of the fluid. For example, the fluid conduit 289 may be a pipe that is made of or coated with a material that does not react with the fluid or fluids transported in the fluid conduit 289. The gas supply system 290 includes a chamber 291 that contains and/or is configured to receive a supply of the gas or gasses used in the gain medium 214-1. The gas supply system 290 also includes devices (such as pumps, valves, and/or fluid switches) that enable the gas supply system 290 to remove gas from or inject gas into the discharge chamber 215-1. The gas supply system 290 is coupled to the control system 250. The gas supply system 290 may be controlled by the control system 250 to perform, for example, a refill procedure.

The other N−1 optical oscillators are similar to the optical oscillator 212-1 and have similar or the same components and subsystems. For example, each of the optical oscillators 212-1 to 212-N includes electrodes like the electrodes 213-1a and 213-1b, a spectral analysis apparatus like the spectral analysis apparatus 298-1, and an output coupler like the output coupler 296-1. Moreover, the voltage source 297 may be electrically connected to the electrodes in each of the optical oscillators 212-1 to 212-N, or the voltage source 297 may be implemented as a voltage system that includes N individual voltage sources, each of which is electrically connected to the electrodes of one of the optical oscillators 212-1 to 212-N.

The optical source apparatus 210 also includes a beam control apparatus 217 and a beam combiner 218. The beam control apparatus 217 is between the gaseous gain media of the optical oscillators 212-1 to 212-N and the beam combiner 218. The beam control apparatus 217 determines which of the light beams 216-1 to 216-N are incident on the beam combiner 218. The beam combiner 218 forms the exposure light beam 211 from the light beam or light beams that are incident on the beam combiner 218. For example, the beam combiner 218 may redirect all the light beams that are incident upon it toward the scanner apparatus 280.

In the example shown, the beam control apparatus 217 is represented as a single element. However, the beam control apparatus 217 may be implemented as a collection of individual beam control apparatuses. For example, the beam control apparatus 217 may include a collection of N shutters, with one shutter being associated with each of the optical oscillators 212-1 to 212-N. Each of the N shutters may be a mechanical shutter or an electro-optical shutter. Each of the N shutters has a first state that blocks the respective light beam 216-1 to 216-N and a second set that transmits the respective light beam 216-1 to 216-N.

The optical source apparatus 210 may include other components and systems. For example, the optical source apparatus 210 may include a beam preparation system 299. The beam preparation system 299 may include a pulse stretcher (not shown) that stretches each pulse that interacts with the pulse stretcher in time. The beam preparation system also may include other components that are able to act upon light such as, for example, reflective and/or refractive optical elements (such as, for example, lenses and mirrors), and/or filters. In the example shown, the beam preparation system 299 is positioned in the path of the exposure light beam 211. However, the beam preparation system 299 may be placed at other locations within the optical lithography system 200. Moreover, other implementations are possible. For example, the optical source apparatus 210 may include N instances of the beam preparation system 299, each of which is placed between the beam combiner 218 and one of the chambers 215-1 to 215-N and positioned to interact with one of the light beams 216-1 to 216-N. In another example, the optical source apparatus 210 may include optical elements (such as mirrors) that steer the light beams 216-1 to 216-N toward the beam combiner 218.

The system 200 also includes the scanner apparatus 280. The scanner apparatus 280 exposes a wafer 282 with a shaped exposure light beam 211'. The shaped exposure light beam 211' is formed by passing the exposure light beam 211 through a projection optical system 281. The scanner apparatus 280 may be a liquid immersion system or a dry system. The scanner apparatus 280 includes the projection optical system 281 through which the exposure light beam 211 passes prior to reaching the wafer 282, and a sensor system or metrology system 270. The wafer 282 is held or received on a wafer holder 283. The scanner apparatus 280 also may include, for example, temperature control devices (such as air conditioning devices and/or heating devices), and/or power supplies for the various electrical components.

The amount of energy delivered to the wafer 282 by the shaped exposure light beam 211' per unit area over an exposure time (or a particular number of pulses of the shaped exposure light beam 211') is referred to as the dose or the exposure energy. The dose may be expressed in, for example, in units of Joules. The formation of the microelectronic features on the wafer 282 depends on the proper dose (a "target dose") reaching the wafer 282. If too little energy reaches the wafer 282 over the exposure time (the dose is too low and is less than the target dose), the radiation-sensitive material of the wafer 282 is not activated and the micro-electronic features are not formed or are incompletely formed on the wafer 282. If too much energy reaches the wafer 282 over the exposure time (the dose is too high and is greater than the target dose), the radiation-sensitive material of the wafer 282 can be exposed outside of the bounds of the image of the slit pattern and the micro-electronic features are improperly formed on the wafer 282. Thus, minimization or reduction of dose error, which is a difference between the dose and the target dose, is important to the accurate and efficient performance of the optical lithography system 200. The energy control module 260 reduces or eliminates dose error.

The metrology system 270 includes a sensor 271. The sensor 271 may be configured to measure a property of the shaped exposure light beam 211' such as, for example, bandwidth, energy, pulse duration, and/or wavelength. The sensor 271 may be, for example, a camera or other device that is able to capture an image of the shaped exposure light beam 211' at the wafer 282, or an energy detector that is able to capture data that describes the amount of optical energy at the wafer 282 in the x-y plane.

In the implementation shown in FIG. 2A, the metrology system 270 is not coupled to the control system 250. However, in other implementations, the metrology system 270 is coupled to the control system 250. In these implementations, the metrology system 270 provides data to the control system 250, and the control system 250 may issue commands to the metrology system 270. Moreover, in some implementations, the sensor 271 may generate the energy property signal 246. Furthermore, the control system 250 may be implemented as part of the scanner apparatus 280.

The control system 250 includes an electronic processing module 251, an electronic storage 252, and an I/O interface 253. The electronic processing module 251 includes one or more processors suitable for the execution of a computer program such as a general or special purpose microprocessor, and any one or more processors of any kind of digital computer. Generally, an electronic processor receives instructions and data from a read-only memory, a random access memory (RAM), or both. The electronic processing module 251 may include any type of electronic processor. The electronic processor or processors of the electronic processing module 251 execute instructions and access data stored on the electronic storage 252. The electronic processor or processors are also capable of writing data to the electronic storage 252.

The electronic storage 252 may be volatile memory, such as RAM, or non-volatile memory. In some implementations, and the electronic storage 252 includes non-volatile and volatile portions or components. The electronic storage 252 may store data and information that is used in the operation of the control system 250. For example, the electronic storage 252 may store specification information for the light beams 216-1 to 216-N, the exposure light beam 211, and/or the shaped exposure light beam 211'. The specification information may include, for example, target energy, wavelength, and/or spectral bandwidth.

The electronic storage 252 also may store instructions (for example, in the form of a computer program) that cause the control system 250 to interact with other components and subsystems in the optical lithography system 200. For example, the instructions include instructions that implement the energy control module 260. The electronic storage 252 also stores rules, information, or instructions that govern the operation of an oscillator selection module (such as the oscillator selection module 162 of FIG. 1B). The oscillator selection module 162 may be implemented based on predefined rules or a recipe that controls which of the N optical oscillators 212-1 to 212-N receive the excitation signal 268 at a particular time. The electronic storage 252 also may store information received from the optical lithography system 200, the scanner apparatus 280, and/or the optical source apparatus 210.

The I/O interface 253 is any kind of interface that allows the control system 250 to exchange data and signals with an operator, the optical source apparatus 210, the scanner apparatus 280, and/or an automated process running on another electronic device. For example, in implementations in which rules or instructions stored on the electronic storage 252 may be edited, the edits may be made through the I/O interface 253. The I/O interface 253 may include one or more of a visual display, a keyboard, and a communications interface, such as a parallel port, a Universal Serial Bus (USB) connection, and/or any type of network interface, such as, for example, Ethernet. The I/O interface 253 also may allow communication without physical contact through, for example, an IEEE 802.11, Bluetooth, or a near-field communication (NFC) connection.

The control system 250 is coupled to the optical source apparatus 210 through the data connection 254. The data connection 254 may be a physical cable or other physical data conduit (such as a cable that supports transmission of data based IEEE 802.3), a wireless data connection (such as a data connection that provides data via IEEE 802.11 or Bluetooth), or a combination of wired and wireless data connections. The data that is provided over the data connection may be set through any type of protocol or format. The data connection 254 is connected to the optical source apparatus 210 at a communication interface. The communication interfaces may be any kind of interface capable of sending and receiving data. For example, the data interfaces may be any of an Ethernet interface, a serial port, a parallel port, or a USB connection. In some implementations, the data interfaces allow data communication through a wireless data connection. For example, the data interfaces may be an IEEE 811.11 transceiver, Bluetooth, or an NFC connection. The control system 250 may be connected to systems and/or components within the optical source apparatus 210. For example, the control system 250 may be directly connected to each of the optical oscillators 212-1 to 212-N.

Referring also to FIG. 2B, the projection optical system 281 includes a slit 284, a mask 285, and a projection objective, which includes a lens system 286. The lens system 286 includes one or more optical elements. The exposure light beam 211 enters the scanner apparatus 280 and impinges on the slit 284, and at least some of the exposure light beam 211 passes through the slit 284 to form the shaped exposure light beam 211'. In the example of FIGS. 2A and 2B, the slit 284 is rectangular and shapes the exposure light beam 211 into an elongated rectangular shaped light beam, which is the shaped exposure light beam 211'. The mask 285 includes a pattern that determines which portions of the shaped light beam are transmitted by the mask 285 and which are blocked by the mask 285. Microelectronic features are formed on the wafer 282 by exposing a layer of radiation-sensitive photoresist material on the wafer 282 with the exposure light beam 211'. The design of the pattern on the mask is determined by the specific microelectronic circuit features that are desired.

Each of the optical oscillators 212-1 to 212-N is associated with a different transfer function. The one or ones of the optical oscillators 212-1 to 212-N that receive the excitation signal 368' change over time depending on the application. The energy control module 260 corrects for the variations in the transfer functions, as discussed with respect to FIGS. 3A-3F, 4A-4F, and 5A-5D.

FIG. 3A is a block diagram of an energy control module 360. The energy control module 360 may be implemented as part of the control system 150 or the control system 250 (FIG. 2A). For example, the energy control module 360 may be used as the energy control module 160 or the energy control module 260. The energy control module 360 is discussed with respect to the system 200.

The energy control module 360 includes a first comparator 363, a delay module 367, an excitation determination module 361, a correction module 364, an oscillator selection module 362, and a second comparator 365.

The first comparator 363 implements a comparison function such as, for example, a subtraction. The first comparator 363 receives an energy property signal 346 and the value of Etarget 371. The energy property signal 346 is produced by an energy detection system, such as the energy detection system 245. The energy property signal 346 includes an indication of an amount of optical energy in a pulse k−1, which is the pulse immediately before a pulse k. Etarget 371 is the value of the target or desired optical energy for the optical pulses in the exposure light beam 211. The value of Etarget 371 may be stored on the electronic storage 252 and accessed by the energy control module 360. The value of Etarget 371 and/or the indication of the amount of optical energy in the energy property signal 346 may be processed prior to being received by the first comparator 363. For example, if the value of Etarget 371 is in units of energy (Joules), and the indication of the amount of optical energy in the energy property signal 246 is in units of energy (Watts), the indication is converted to units of energy prior to being received at the first comparator 363. The first comparator 363 determines an energy error 366, which is the difference between the amount of energy in the pulse k−1 and Etarget 371.

The energy error 366 is provided to the excitation determination module 361. The excitation determination module 361 determines characteristics of an excitation signal 368 based on the energy error 366 (which in turn is based on the indication of the amount of energy in the energy property signal 346). The excitation signal 368 is provided to the correction module 364. The correction module 364 determines a corrected excitation signal 368' based on the excitation signal 368.

The oscillation selection module 362 includes a chamber selector 374, which determines which of the N optical oscillators 212-1 to 212-N receives a corrected excitation signal 368'. The chamber selector 374 may, for example, implement a remainder function that returns the reminder of a division operation that divides k by M, where M is an integer number that represents the number of the N optical oscillators that are available to produce optical pulses. M may be, for example, two, N, or any number less than or equal to N. For example, if the chamber selector 374 is implemented as a remainder function and M=2, then the chamber selector 374 returns 0 for pulses with an even k index number, and 1 for pulses with an odd k index number. In these implementations, when the chamber selector 374 returns 0, the oscillation selection module 362 provides the corrected excitation signal 368' to the optical oscillator 212-1. When the chamber selector 374 returns 1, the oscillation selection module 362 provides the corrected excitation signal 368' to the optical oscillator 212-2. Other implementations of the chamber selector 374 are possible. Moreover, more than one of the M optical oscillators may receive the corrected excitation signal 368' at the same time.

The one or ones of the N optical oscillators 212-1 to 212-N that receive the corrected excitation signal 368' change over time. The correction module 364 corrects the excitation signal 368 to account for the variation in the transfer functions of the optical oscillators 212-1 to 212-N.

For example, and referring to FIG. 3B, the correction module 364 may be a notch filter 364. In the time domain, the notch filter 364 may be expressed as shown in Equation (1):

$$y(k)=x(k-1)-y(k-1) \quad \text{Equation (1),}$$

where k is an integer that is greater than 2 and represents the pulse number, x (the input of the filter 364) is the excitation signal 368, and y (the output of the filter 364) is the corrected excitation signal 368'. The value of k resets to 1 at the beginning of each burst of pulses.

FIG. 3B shows an example of the frequency response (amplitude as a function of frequency) of the notch filter 364. The notch filter 364 rejects signals having a frequency in a frequency band f and transmits signals having frequencies outside of the frequency band f. The notch filter 364 transmits the least amount of signal at a frequency f0. The frequency f0 and the frequency band f of the notch filter 364 are configured to reject energy disturbances that may occur due to using pulses of light from more than one optical oscillator in the exposure light beam 211. For example, as discussed above, in an approach that does not include the correction module 364, if the oscillator selection module 362 is configured to alternate between two of the N optical oscillators 212-1 to 212-N, the energy of the pulses in the exposure light beam 211 oscillates at a frequency that is equal to the repetition rate of the individual optical oscillators. This oscillation is removed by the notch filter 364 such that the energy of the pulses in the exposure light beam 211 all have substantially the same amount of energy.

Figure 3C:
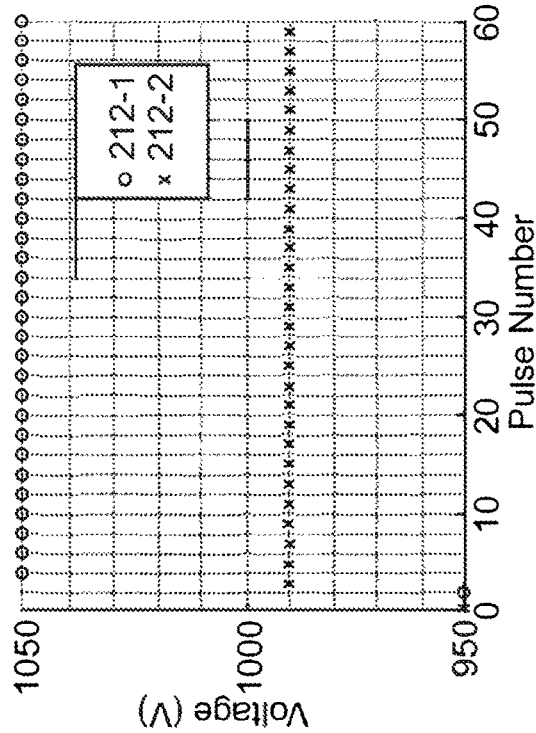
FIGS. 3C-3F are plots of various data features optical pulses.
Figure 3D:
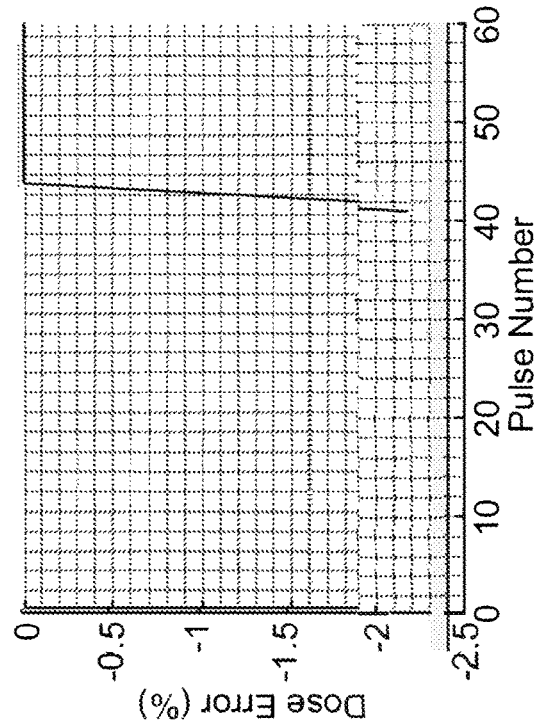
Figure 3E:
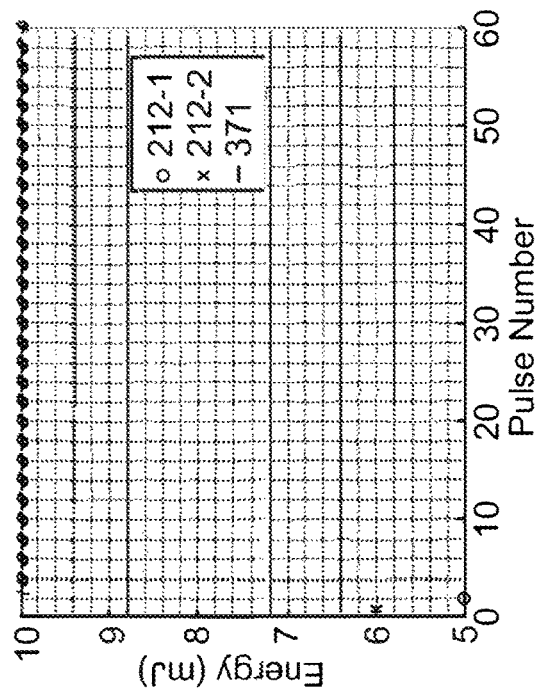
Figure 3F:
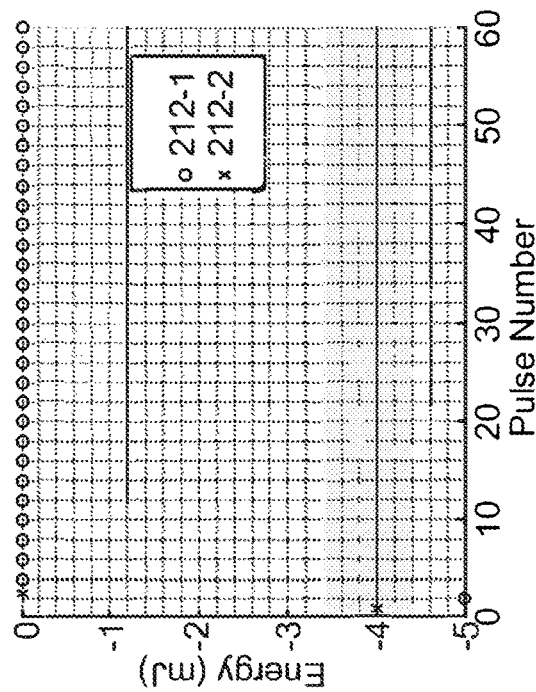

FIGS. 3C-3F show simulated results of the energy control module 360. FIG. 3C is a plot of pulse energy 346 (in millijoules) as a function of pulse number k. The pulse energy of pulses produced by a first one of the N optical oscillators 212-1 is shown with the "o" symbol. The pulse energy of pulses produced by a second one of the N optical oscillators 212-2 is shown with the "x" symbol. The target energy 371 is shown by a straight line. Except for the x and o symbols at pulse numbers 1 and 2, the x and o symbols in FIG. 3C (212-1 and 212-2) effectively overlap with the line (371). FIG. 3D is a plot of the corrected excitation signal 368', which is the output of the notch filter 364, as a function of pulse number k. FIG. 3E is a plot of the energy error 366 as a function of pulse number k. Except for the x and o symbols at pulse numbers 1 and 2, the x and o symbols in FIG. 3E (212-1 and 212-2) effectively overlap with the line (371). FIG. 3F is a plot of dose error as a function of pulse number k. Dose error values are not shown for pulse numbers 1 to 39 in FIG. 3F. The dose error shown in FIG. 3F is provided as a percentage of the target dose. As shown in FIGS. 3D and 3E, after the first few pulses (about 10 pulses) in the burst, the pulse energy is substantially the same for all of the pulses. As shown in FIG. 3F, after about 40 pulses from the beginning of the burst, the dose error becomes zero. This is in contrast to the data shown in FIG. 1D (which shows simulated results from a legacy system that does not include the energy control module 360). As discussed above, FIG. 1D shows a plot of the pulse energy as a function of pulse number in a situation in which a correction module is not used. Thus, the notch filter 364 results in a lower dose error or elimination of the dose error and a more stable dose, thereby improving the overall performance of a lithography system that includes the energy control module 360.

FIG. 4A is a block diagram of an energy control module 460. The energy control module 460 is another implementation of the energy control module 160. The energy control module 460 includes the first comparator 363, the delay module 367, an excitation determination module 461, the oscillator selection module 362, the second comparator 365, a correction module 464, and a third comparator 469. The excitation determination module 461 determines an excitation signal 468 based on the energy error 366. FIG. 4B is a block diagram of the excitation determination module 461. The excitation determination module 461 includes a modeling module 473. The modeling module 473 includes N transfer function models 475-1 to 475-N, with each of the models 475-1 to 475-N being associated with a respective one of the optical oscillators 212-1 to 212-N. Each of the models 475-1 to 475-N estimates the transfer function 219-1 to 219-N associated with a respective one of the N optical oscillators 212-1 to 212-N. The modeling module 473 includes a model selector 474, which selects the model associated with the optical oscillator that produces the kth pulse. The model selector 474 is similar to the chamber selector 374 and may be implemented in the same manner.

The correction module 464 is implemented as a Kalman filter. The correction module 464 (or Kalman filter 464) uses the energy error 366 and the excitation signal 468 to determine an output signal 464'. The output signal 464' is provided to the comparator 469.

The comparator 469 determines a corrected excitation signal 468' based on the output signal 464' and the excitation signal 368. The equations 2 through 8 relate to the implementation of the correction module 464:

$$K\_e(k) = \frac{-Eerror(k)}{dedv(Chamber(k))} - HVcommand(k), \quad \text{Equation (2)}$$

where k is an integer number of 1 or greater that represents the pulse number in the exposure light beam 211, Error(k) is the energy error 366 of the kth pulse, dedv(Chamber(k)) is the model in the modeling module 473 that is associated with the optical oscillator used to produce the kth pulse in the exposure light beam 211, and HVcommand(k) is the excitation signal applied to produce the kth pulse;

$$K\_S(k)=K\_P\_\text{pred}(k)+R \quad \text{Equation (3),}$$

where R is a tuning parameter and K_P_pred is given by Equation (8); and the gain of the Kalman filter 464 is K_K and is determined according to Equation 4:

$$K\_K(k) = \frac{K\_P\_\text{pred}(k)}{K\_S(k)}. \quad \text{Equation (4)}$$

The remaining expressions used to implement the Kalman filter 464 are as follows:

$$K\_X\_\text{post}(k)=K\_X\_\text{pred}(:,k)+K\_K(k)*K\_e(k) \quad \text{Equation (5);}$$

$$K\_P\_\text{post}(k)=(1-K\_K(k))*K\_P\_\text{pred}(k)*(1-K\_K(k)*C)+K\_K(k)*R*K\_K(k)' \quad \text{Equation (6),}$$

where C is a tuning parameter of the Kalman filter and is equal to 1 in this implementation;

$$K\_X\_\text{pred}(k+1)=A*K\_X\_\text{post}(k) \quad \text{Equation (7);}$$

$$K\_P\_\text{pred}(k+1)=A*K\_P\_\text{post}(k)*A'+Q \quad \text{Equation (8),}$$

where A=−1 and Q is a tuning parameter of the Kalman filer 464. More specifically, Q is the covariance of the process noise, and R is the covariance of the observation noise.

However, Q and R may be implemented as tuning parameters if the covariances are difficult to estimate.

The output 464' of the Kalman filter 464 is K_ P_pred, which is determined based on Equation 8. The third comparator 469 determines the corrected excitation signal 468' for the kth pulse of the exposure light beam 211 as follows:

$$HVSP(k) = HVCommand(k) + HVDefault - K\_P\_pred(k) \text{ Equation} \quad (9),$$

where HSVP(k) is the corrected excitation signal 468' that is applied to the selected optical oscillator to produce the kth pulse in the exposure light beam 211, HVCommand (k) is the uncorrected excitation signal 468 determined by the excitation determination module 461 for the kth pulse, HVDefault is a parameter that estimates a nominal excitation signal for the optical oscillators 212-1 to 212-N, and K_P_pred (:, :, k) is the output 464' of the Kalman filter 464 for the kth pulse. The value of HVDefault may be stored on the electronic storage 252 and retrieved by the energy control module 460. The value of HVDefault may be a magnitude of a voltage and may be, for example, a value that is greater than 100 Volts.

FIGS. 4C-4F show simulated results of using the energy control module 460 for an implementation in which the oscillator selection module 362 alternates between providing the corrected excitation signal 468' to a first optical oscillator 212-1 and a second optical oscillator 212-2 on a pulse-to-pulse basis. In other words, every other pulse of the exposure light beam 211 is produced by the first optical oscillator 212-1 and the remaining pulses are produced by the second optical oscillator 212-2. The data shown in FIGS. 4C-4F is for a burst of pulses, where the pulses are indexed by k, k is an integer value, and the burst begins with the pulse k=1.

Figure 4C:
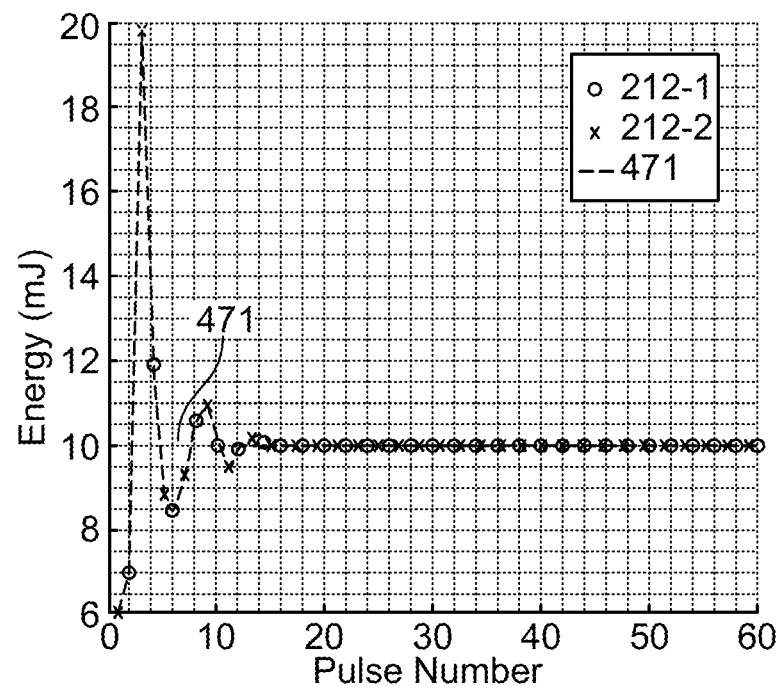
FIGS. 4C-4F are plots of various data features optical pulses.

FIG. 4C shows the energy signal 446 as a function of pulse number k for a burst of pulses of the exposure light beam 211. In FIG. 4C, the energy of the pulses produced by the first optical oscillator 212-1 is shown with circle symbols, and the energy of the pulses produced by the second chamber is shown with "x" symbols. The target energy is represented by element number 471. The target energy 471 is a constant value that is shown by a short dashed line style. As shown in FIG. 4C, after the first few pulses, the energy of the pulses in the exposure light beam 211 becomes approximately equal to the target energy 471 (and the x and o symbols in FIG. 4C (212-1 and 212-2) effectively overlap with the line (471)) even though the pulses are produced by the two different optical oscillators 212-1 and 212-2. Thus, as compared to a situation in which the correction module 464 is not used (such as shown in FIG. 1D), using the correction module 464 results in the exposure light beam 211 having a more consistent pulse energy over time.

Figure 4D:
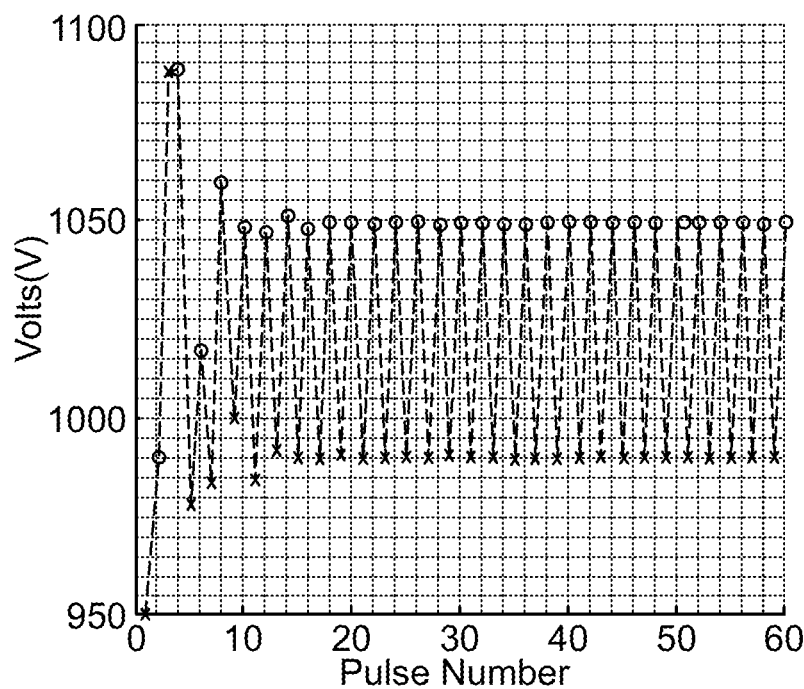
Figure 4E:
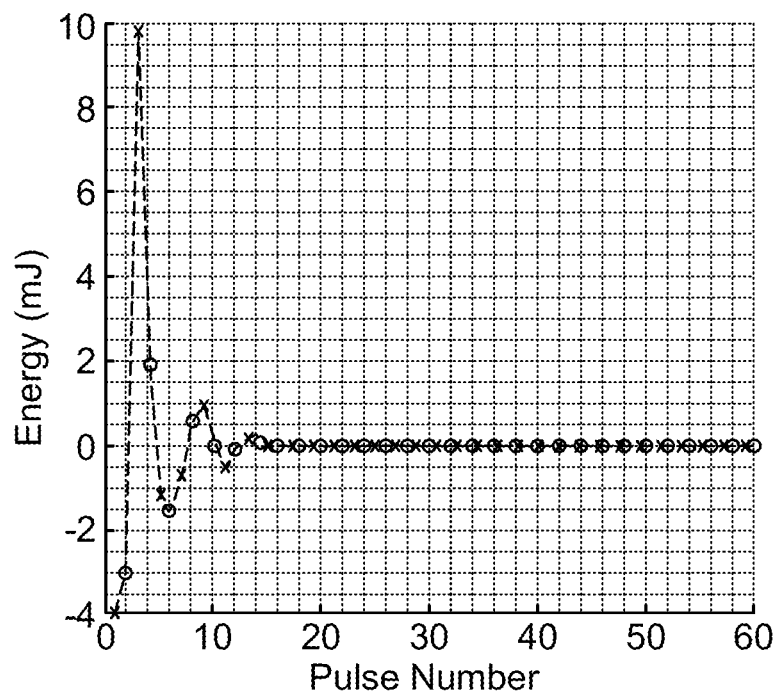
Figure 4F:
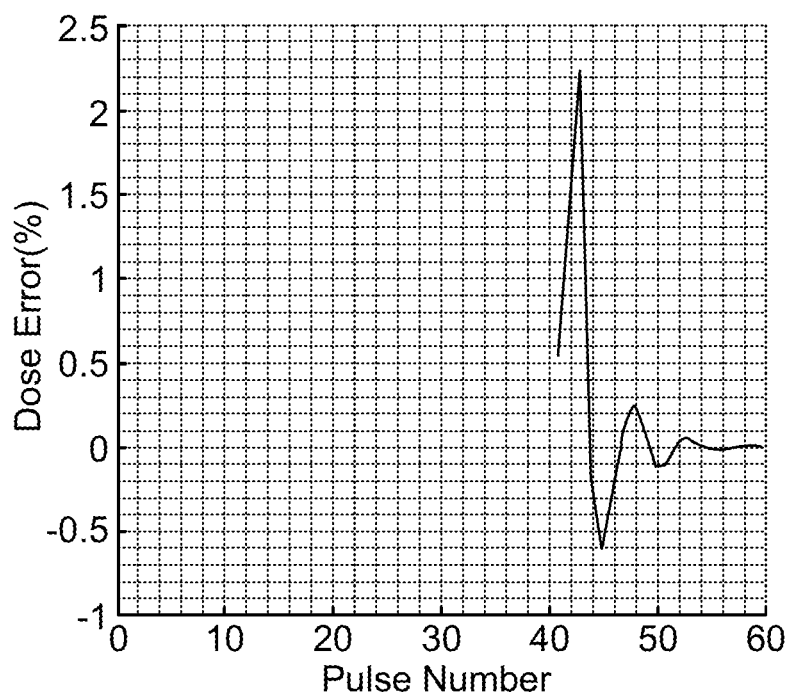

FIG. 4D shows the corrected excitation signal 468' as a function of pulse number k. The voltage applied to the first optical oscillator 212-1 is shown with open circles. The voltage applied to the second optical oscillator 212-1 is shown with an "x" symbol. FIG. 4E shows the energy error 366 as a function of pulse number k. The energy error for pulses produced by the first optical oscillator 212-1 is shown with open circles. The energy error for pulses produced by the second optical oscillator 212-1 is shown with an "x" symbol. As shown in FIG. 4E, the energy error for pulses produced by the first optical oscillator 212-1 and the second optical oscillator 212-2 converges rapidly to approximately zero (after which the x and o symbols in FIG. 4E (212-1 and 212-2) effectively overlap). FIG. 4F shows the dose error as a function of the pulse number k. As shown in FIG. 4F, the dose error is negligible after about 55 pulses. The dose error values for pulse numbers 1 to 39 are not shown on FIG. 4F.

FIG. 5A is a block diagram of an energy correction module 560. The energy correction module 560 is another implementation of the energy correction module 560 (FIG. 1A). The energy correction module 560 uses a feed-forward approach to reject or reduce pulse-to-pulse energy disturbances or energy variations that occur because more than one of the optical oscillators 212-1 to 212-N are used to create the pulses of the exposure light beam 211.

The energy correction module 560 includes the delay module 367, an excitation determination module 561, and the oscillation selection module 362. The excitation determination module 561 determines a corrected excitation signal 568' and provides the corrected excitation signal 568' to the optical oscillator selection module 362. FIG. 5B is a block diagram of the excitation module 561. The excitation determination module 561 includes a feedback controller 587. In the example of FIG. 5B, the feedback controller 587 is a proportional-integral-derivative (PID) controller that receives the error signal 366 and produces an output that is applied to one of the models 475-1 to 475-N in the model module 473. The PID controller includes a proportional gain 580, an integrator gain 581, and an integrator 582. Although a PID controller is discussed in this example, any feedback controller may be used as the feedback controller 587.

The model selector 474 selects the model that is associated with the optical oscillator that produces the kth pulse of the exposure light beam 211. The output of the model module 473 is provided to a second integration module, which includes a gain 584 and an integrator 585. A feed-forward correction signal 567 is provided to the integrator 585. The feed-forward correction signal 567 removes, reduces, or rejects energy disturbances such as those illustrated in FIG. 1D. The feedback signal 567 corrects for the energy differences between the various gain mediums 214-1 to 214-N of the respective optical oscillators 212-1 to 212-N.

The corrected excitation signal 568' is determined as shown in Equation (10):

$$V(k+1) = V^*(Ch_{k+1}) + \frac{dedv(Ch_k)}{dedv(Ch_{k+1})}(V(k+1) - V^*(Ch_k)) + \frac{E^*(Ch_k) - E^*(Ch_{k+1})}{dedv(Ch_{k+1})}, \quad \text{Equation (10)}$$

where k is an integer that is greater than or equal to 1 and represents the pulse number of a pulse in the exposure light beam 211, $Ch_k$ is the optical oscillator 212-1 to 212-N that produces the kth pulse in the exposure light beam 211, and $dedv(Ch_k)$ is the model 475-1 to 475-N that models the transfer function of the optical oscillator 212-1 to 212-N used to produce the kth pulse. V* and E* are determined as part of the modeling. Each models 475-1 to 475-N describes the corresponding change in energy produced by the respective optical oscillator 212-1 to 212-N when the applied voltage changes. V* is the actual voltage that is applied to the electrodes of one of the optical oscillators 212-1 to 212-N, and E* is the corresponding measured energy produced as a result of the application of that voltage. In some implementations, a low-pass filter is applied to the voltage and energy values to reduce or remove noise from the values of E* and V*. To provide a more specific example, E* for the optical oscillator 212-1 may be determined by:

$$E^* = LPF(E(1), E(3), E(5) \ldots, E(1)) \quad \text{Equation (11)},$$

and V* for the optical oscillator 212-1 may be determined by:

$$V^* = LPF(V(1), V(3), V(5) \ldots, V(1)) \quad \text{Equation (12),}$$

where LPF is any type of low-pass filtering function (such as a moving average), E(1) is an measured energy of the lth pulse in the exposure light beam 211, V(1) is the voltage applied to the optical oscillator 212-1 to produce the lth pulse. In the example of Equations 11 and 12, the optical source apparatus 210 operates in the "tic-toc" mode, and the optical oscillator 212-1 produces odd-numbered pulses of the exposure light beam 211, and the optical oscillator 212-2 produces even-numbered pulses of the exposure light beam 211. V* and E* for the optical oscillator 212-2 (or another optical oscillator) is determined based on Equations 11 and 12, using the voltage and energy values appropriate for that optical oscillator.

Figure 5C:
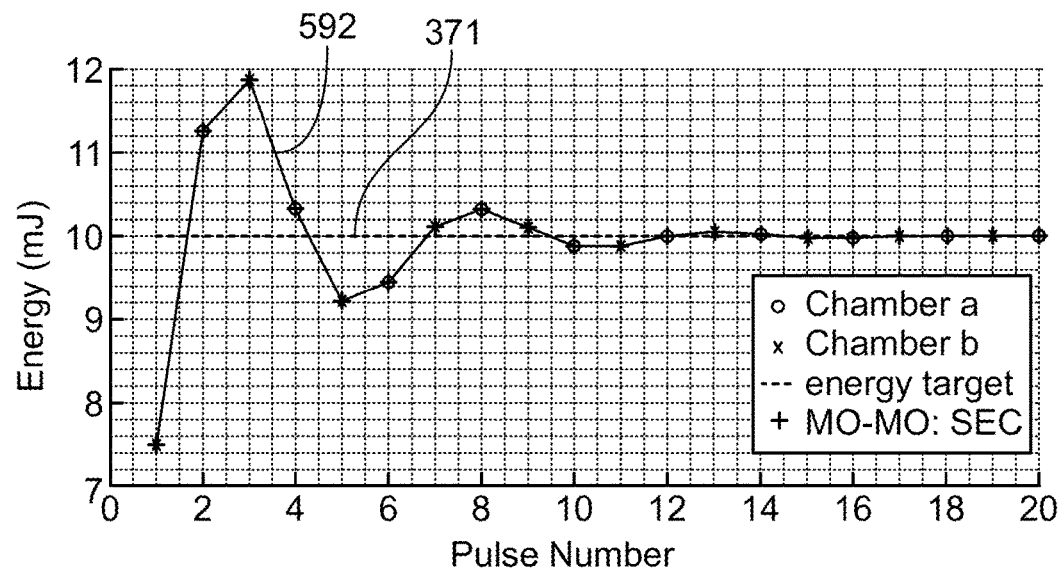
FIGS. 5C and 5D are plots of various data features optical pulses.
Figure 5D:
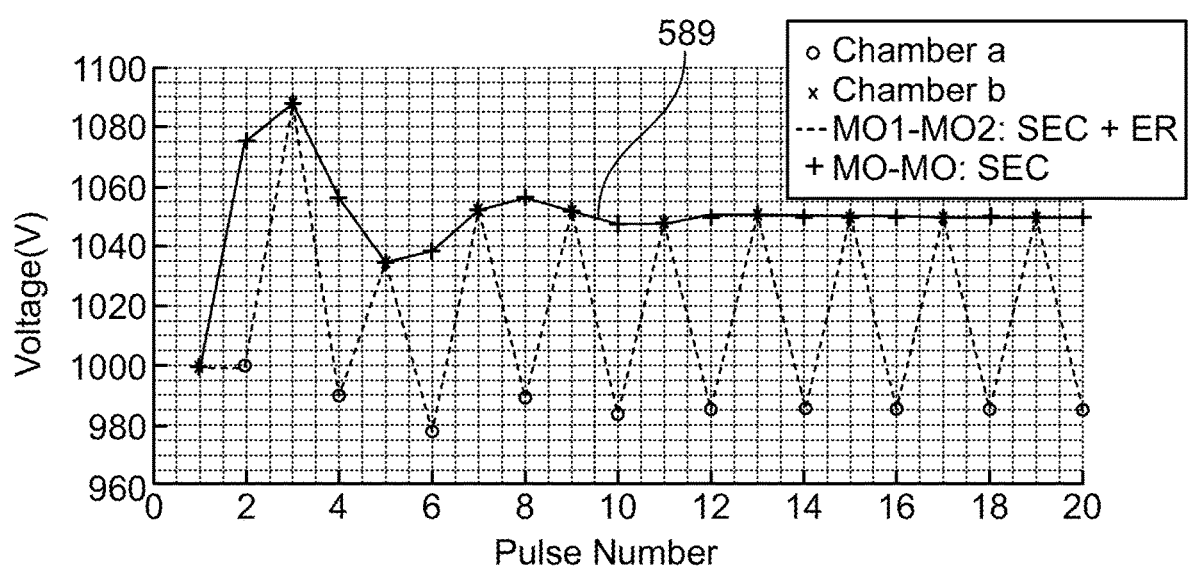

FIGS. 5C and 5D show simulated results for a scenario in which the oscillator selection module 362 is configured to alternate between a first optical oscillator 212-1 and a second optical oscillator 212-N on a pulse-by-pulse basis using the feed-forward energy correction module 560. FIG. 5C shows pulse energy of the exposure light beam 211 as a function of pulse number k. The energy of the pulses produced by the first optical oscillator 212-1 is shown with circle symbols. The energy of the pulses produced by the second optical oscillator 212 is shown with "x" symbols. The target energy 371 is represented by a dotted line and is constant for all pulses in the exposure light beam 211. For comparison, the optical energy in the exposure light beam 211 in a situation in which only one of the N optical oscillators was used to produce all k pulses is shown with a solid line labeled 592. As shown in FIG. 5C, the energy of the pulses in the exposure light beam 211 approaches or is equal to the target energy 371 after about 12 pulses, regardless of whether the exposure light beam 211 was produced with a single optical oscillator or by alternating between activating the first optical oscillator 212-1 and the second optical oscillator 212-2 on a pulse-by-pulse basis.

FIG. 5D shows the voltage applied to the optical oscillator as a function of pulse number k. In FIG. 5D, voltages applied to the first optical oscillator 212-1 are shown with a circle, and voltages applied to the second optical oscillator 212-2 are shown with an "x" symbol. The data shown with circles and "x" represent simulated data from a system that included the energy correction module 560. Additionally, an approach that does not switch between the first optical oscillator 212-1 and the second optical oscillator 212-2 but instead only uses the optical oscillator 212-2 to generate the exposure light beam 211 is shown with a solid line style and is labeled with reference number 589. The amplitude of the applied voltage signal changes when the energy correction module 560 is used. The varying voltages account for the differences in the transfer functions and results in the substantially constant pulse energy shown in FIG. 5C. Moreover, the voltage determined by the energy correction module 560 for application to the second optical oscillator 212-2 is substantially equal to the voltage applied to the second optical oscillator 212-2 in the single-oscillator approach. This is apparent because the "x" symbols (which represent voltages the energy correction module 560 determined for the optical oscillator 212-2) are equal to or very similar to the voltages determined in the situation in which the optical oscillator 212-2 is used to generate all of the pulses in the exposure light beam 211. The energy correction module 560 and the feed-forward correction signal 567 allow more than one of the N optical oscillators 212-1 to 212-N to be used to generate the exposure light beam 211 with the same performance results as the scenario in which a single optical oscillator is used. The feed-forward correction signal 567 corrects, adjusts, or translates the applied voltage for each pulse to account for switching between different ones of the N optical oscillators 212-1 to 212-N on a pulse-by-pulse basis. The energy correction module 560 thus allows the exposure light beam 211 to have a higher repetition rate, have a plurality of distinct center wavelengths (when the center wavelengths of the optical oscillators 212-1 to 212-N are intentionally different) and/or other characteristics that would be impossible or challenging to achieve with a single optical oscillator.

Figure 6:
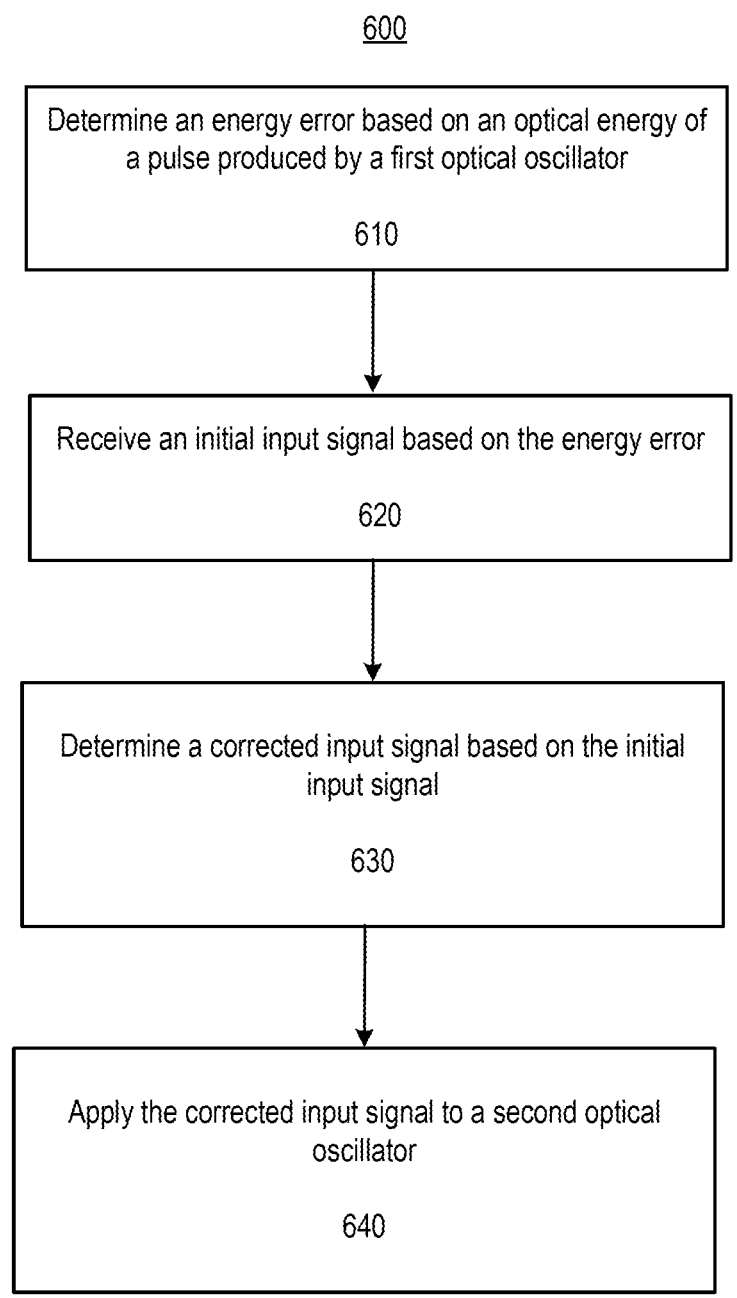
FIG. 6 is a flow chart of an example process.

FIG. 6 is a flow chart of a process 600. The process 600 determines a corrected input signal for application to one of N optical oscillators in an optical source apparatus such as discussed with respect to FIGS. 1A and 2A. The process 600 may be implemented by the control system 150 (FIG. 1A) or the control system 250 (FIG. 2A). The control system 150 and the control system 250 may be implemented as part of the optical source apparatus 210, as part of the scanner apparatus 280, or separate from the optical source apparatus 210 and the scanner apparatus 280 but in communication with the optical source apparatus 210 and/or the scanner apparatus 280.

The energy error 366 is determined (610). The energy error 366 may be determined by subtracting a measured energy (for example, as provided by the energy property signal 246) from the target energy 371. The energy error 366 has a value for each pulse k in the exposure light beam 211. Thus, the energy error 366(k) is the energy error of the kth pulse in the exposure light beam 211. As discussed above, the kth pulse in the exposure light beam 211 is produced by a particular one or ones of the optical oscillators 212-1 to 212-N according to the oscillator selection module 362.

An input signal that is based on the energy error 366 is received (620). The input signal is received at, for example, the excitation determination module 361 (FIG. 3A), the excitation determination module 461 and the Kalman filter 464 (FIG. 4A), or the excitation determination module 561 (FIG. 5A). The input signal may be generated by the scanner apparatus 280. In these implementations, at least part of the control system 250 is implemented as part of the scanner apparatus 250. The scanner apparatus 280 provides the energy property signal 246. In these implementations, the detector 245 may be positioned near the wafer 282 and/or the metrology sensor 271 may provide the energy property signal 246. Implementing at least part of the control system 250 as part of the scanner apparatus 280 may result in a higher quality input signal and one that is less prone to corruption. On the other hand, the control system 250 may be implemented in the optical apparatus 210 to provide a stand-alone device or optical apparatus that can be used with a variety of scanner apparatuses. Moreover, the control system 250 may be implemented separately from the scanner apparatus 280 and the optical apparatus 210.

A corrected input signal is determined based on the input signal (630). The input signal may be filtered by the notch filter 364 (FIG. 3A) or by the Kalman filter 464 (FIG. 4A). In some implementations, the corrected input signal is determined using a feed-forward technique such as shown in FIG. 5A.

The corrected input signal is applied to one of the optical oscillators 212-1 to 212-N that did not produce the kth pulse to produce the (k+1)th pulse of the exposure light beam 211 (640). The energy of the (k+1)th pulse is substantially the same as the energy of the kth pulse due to the correction.

The above examples relate to an application in which the optical source apparatus includes N optical oscillators, where N is an integer greater than one and each of the N optical oscillators is configured to emit a pulsed light beam to a common optical element. However, the control modules 160, 360, 460, and 560 are applicable for use with any optical source apparatus in which the transfer function of one or more optical oscillators in the apparatus varies, regardless of whether the transfer function varies due to switching between different optical oscillators during operation of the optical source apparatus or if the transfer function varies due to using the same optical oscillator under different conditions. For example, the control modules 160, 360, 460, or 560 may be applied to an optical source apparatus that includes a single optical oscillator (such as the optical source apparatus 810 of FIG. 8) or to an optical source apparatus that includes two optical oscillators that are arranged in a master oscillator (MO) power amplifier (PA) arrangement (such as the optical source apparatus 1010 of FIG. 10).

Figure 7A:
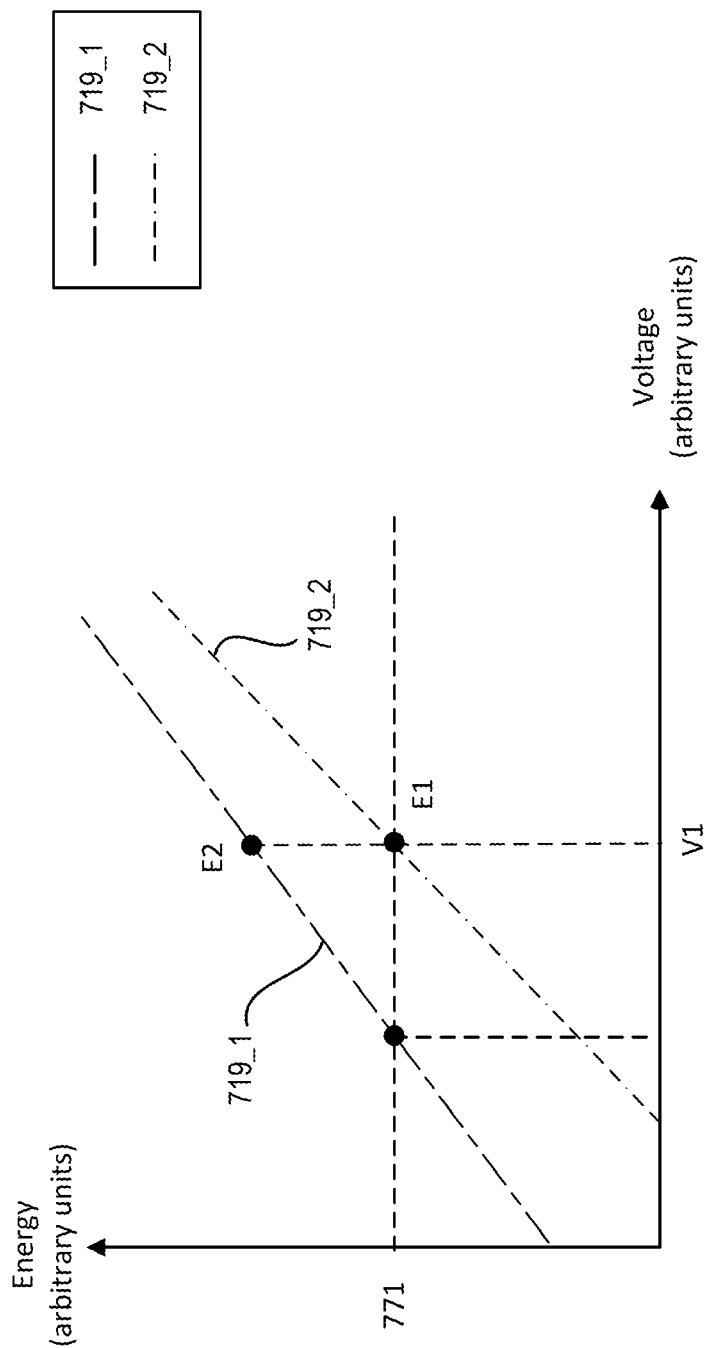
FIG. 7A is an illustration of transfer functions.
Figure 7B:
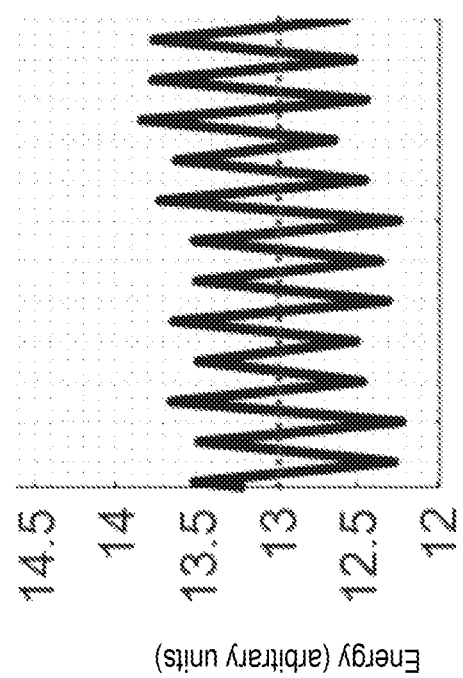
FIGS. 7B and 7C are plots of various data features optical pulses.
Figure 7C:
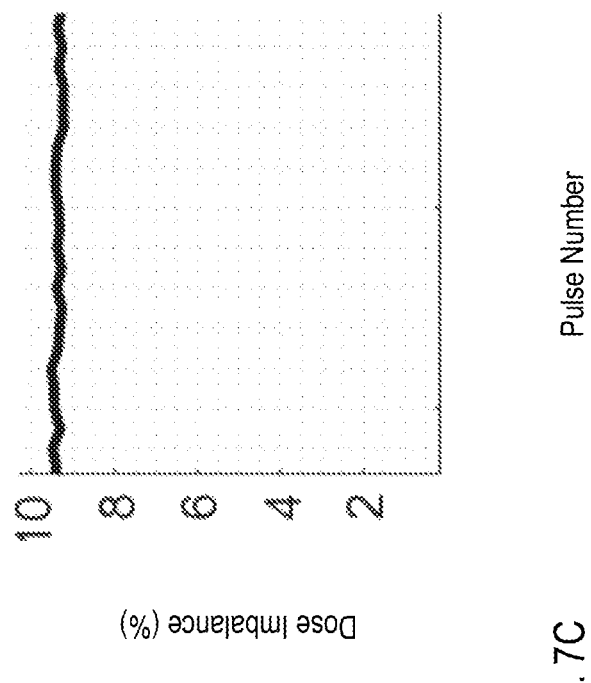

FIGS. 7A-7C show examples of a traditional system that includes a single optical oscillator. The transfer function (the optical energy produced by the single optical oscillator as a function of provided excitation energy) varies with the wavelength of the emitted pulsed light beam. FIG. 7A includes a transfer function 719_1, which is the efficiency of the optical oscillator when the center wavelength of the pulse is a first wavelength ($\lambda 1$), and a transfer function 719_2, which is the efficiency of the optical oscillator when the center wavelength of the pulse is a second wavelength ($\lambda 2$). The transfer functions 719_1 and 719_2 relate the voltage applied to the excitation mechanism of the optical oscillator to the optical energy of a pulse of light produced by the optical oscillator. The transfer functions 719_1 and 719_2 are both linear but have different slopes and different y-intercepts.

The discussion below relates to a traditional system in which a control module such as the modules 160, 360, 460, 560, 1160, or 1260 is not used. The optical oscillator alternates between producing a pulse of light at the first wavelength ($\lambda 1$) and a pulse of light at the second wavelength ($\lambda 2$) to produce a pulsed light beam that has a spectral peak at the first wavelength and a spectral peak at the second wavelength. The system seeks to maintain a target energy 771 for all pulses, regardless of wavelength. The kth pulse has an energy E1 and a center wavelength of $\lambda 2$. After the kth pulse is produced, the optical element is actuated such that the center wavelength of the kth+1 pulse will be $\lambda 1$. The traditional approach determines the voltage to apply to the optical oscillator to produce the kth+1 pulse as the voltage V1, which is the voltage that is associated with the target energy 771 based on the transfer function 719_2. However, the transfer function 719_2 is not an accurate representation of the efficiency for the configuration of the optical oscillator when it is configured to produce pulses in which the center wavelength is the first wavelength ($\lambda 1$). Thus, the second pulse has the energy E2 instead of the target energy 771.

FIG. 7B shows the pulse energy as a function of pulse number. As shown, the energy of the pulses oscillates at the Nyquist frequency (which is half of the repetition rate of the output light beam in the example in which the wavelength is changed on a pulse-by-pulse basis) due to the traditional approach lacking a correction mechanism to address the discrepancy between the transfer functions 719_1 and 719_2. FIG. 7C is the dose imbalance as function of pulse number. The energy imbalance results in a relatively high (about 10%) dose imbalance value.

The energy control modules 1160 (FIG. 11A) and 1260 (FIG. 12A) may be used to account for the change in the transfer function as the wavelength is changed in a single optical oscillator. Before discussing the energy control modules 1160 and 1260, examples of optical source apparatuses that are configured to change the wavelength on pulse-by-pulse basis are discussed.

Figure 8:
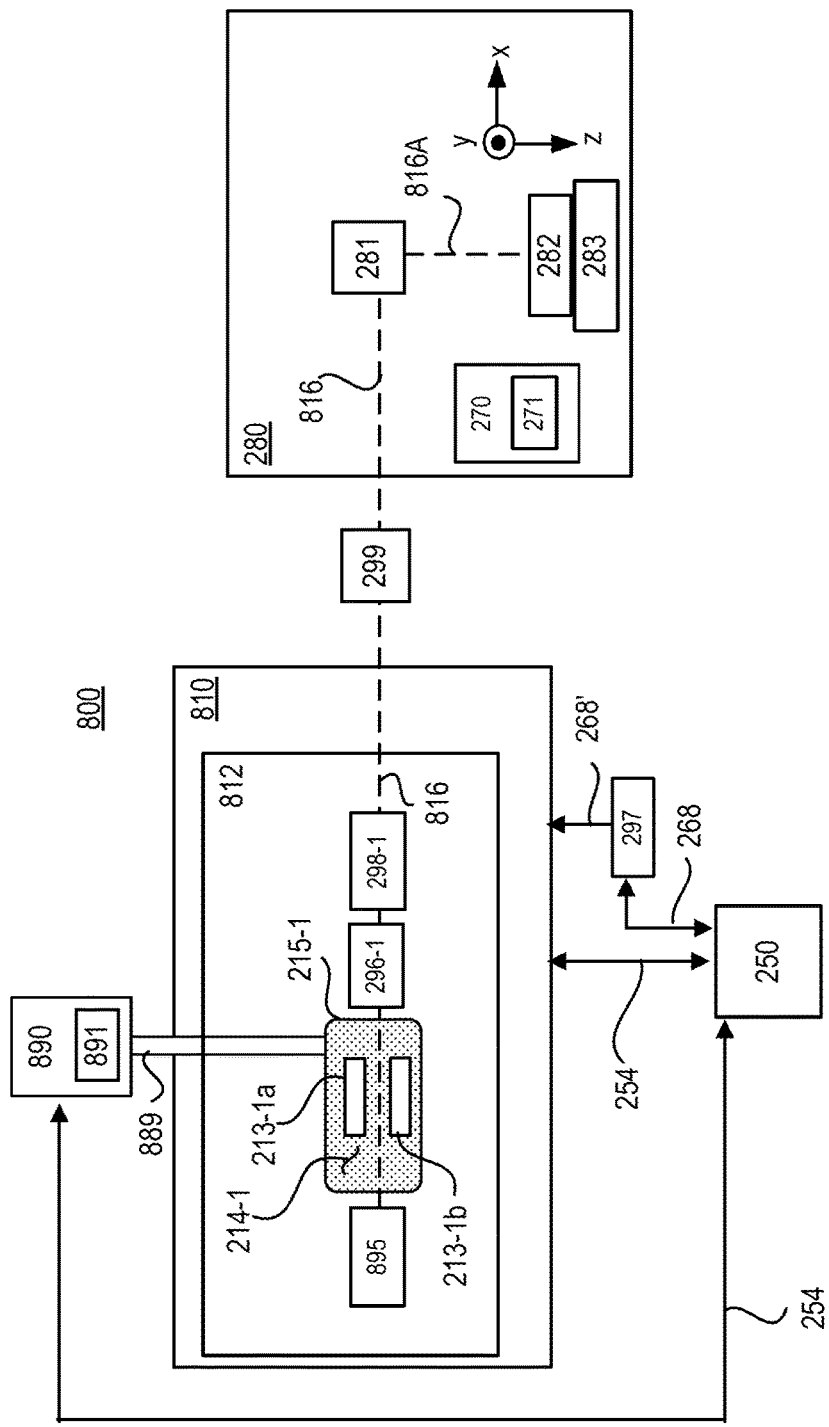
FIGS. 8 and 10 are block diagrams of systems that include other examples of optical source apparatuses.

Referring to FIG. 8, a system 800 includes an optical source apparatus 810 that provides an exposure beam (or output light beam) 816 to the scanner apparatus 280. The system 800 also includes the control system 250. The control system 250 is coupled to the optical source apparatus 810 and to various components associated with the optical source apparatus 810.

The optical source apparatus 810 includes an optical oscillator 812. The optical oscillator 812 generates the output light beam 816. The optical oscillator 812 is the same as any of the N optical oscillators 212 discussed above with respect to FIG. 2A. The various components of the optical oscillator 812 are labeled with the same reference numbers as the optical oscillator 212-1.

Figure 9A:
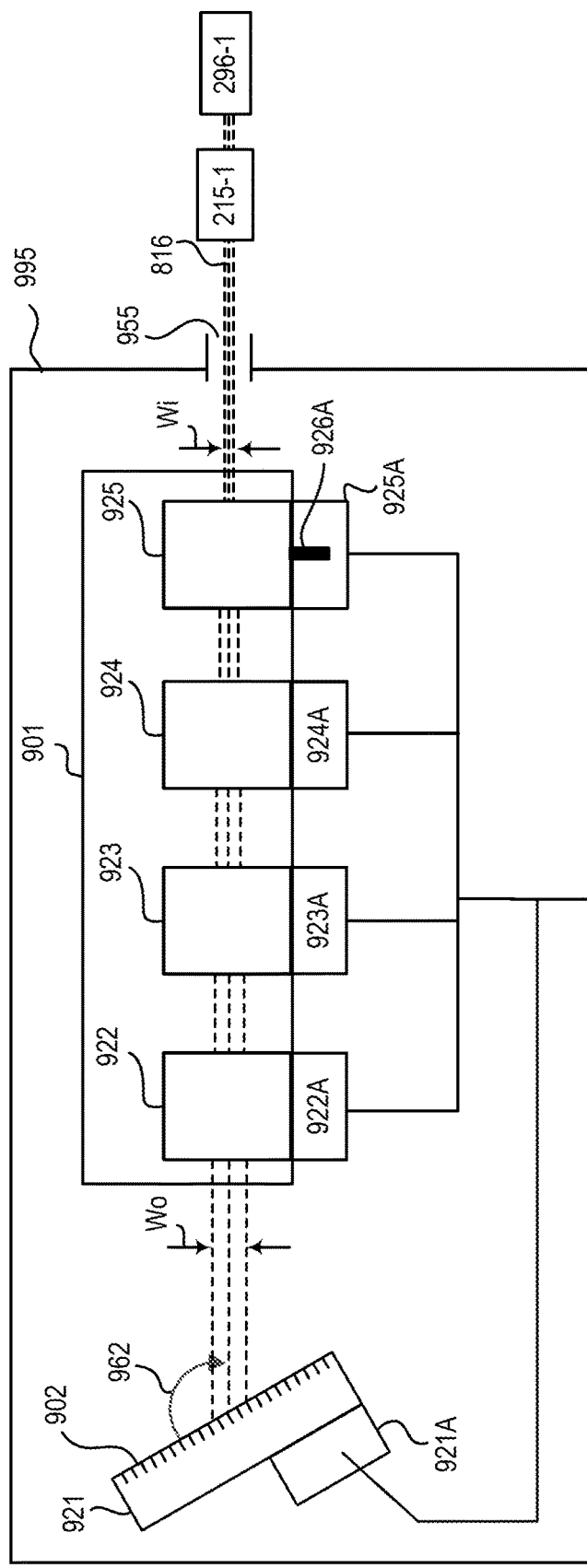
FIGS. 9A and 9B relate to an example of a spectral adjustment apparatus.

A resonator is formed between a spectral adjustment apparatus 895 on one side of the discharge chamber 215-1 and the output coupler 296-1 on a second side of the discharge chamber 215-1. The spectral adjustment apparatus 895 may include a dispersive optic such as, for example, a grating, mirror and/or a prism, that finely tunes the spectral output of the discharge chamber 215-1. The dispersive optic may be reflective or refractive. In some implementations (such as shown in FIG. 9A), the spectral adjustment apparatus 895 includes a plurality of dispersive optical elements. For example, the spectral adjustment apparatus 895 may include four prisms, some of which are configured to control a center wavelength of the light beam 816 and others of which are configured to control a spectral bandwidth of the light beam 816. By adjusting one or more of the prisms or other components in the spectral adjustment apparatus 895, the center wavelength and/or bandwidth of the output light beam 816 is changed. Each unique combination of positions or settings of the various components that produces a different center wavelength is referred to as a configuration of the spectral adjustment apparatus 895.

Referring also to FIG. 9A, a block diagram of a spectral adjustment apparatus 995 is shown. The spectral adjustment apparatus 995 may be used in the optical source apparatus 810 as the spectral adjustment apparatus 895.

The spectral adjustment apparatus 995 includes a set of optical features or components 921, 922, 923, 924, 925 arranged to optically interact with the light beam 816. The control system 250 is connected to one or more actuation systems 921A, 922A, 923A, 924A, 925A that are physically coupled to respective optical components 921, 922, 923, 924, 925. The actuation systems 921A, 922A, 923A, 924A, 925A may include shafts (such as a shaft 926A) that rotate a component coupled to the shaft. The actuation systems 921A, 922A, 923A, 924A, 925A also include electronics and mechanical devices such as, for example, motors and electronic interfaces for communicating with the control system 250 and for receiving electrical power.

The optical component 921 is a dispersive optical element, for example, a grating, mirror and/or a prism. In the example of FIG. 9A, the optical component 921 is a reflective grating that includes a diffractive surface 902. The optical components 922, 923, 924, and 925 are refractive optical elements and may be, for example, prisms. The optical components 922, 923, 924, and 925 form a beam expander 901 that has an optical magnification OM 965. The OM 965 of the light beam 816 through the beam expander 901 is the ratio of the transverse width Wo of the light beam 816 exiting the beam expander 901 to a transverse width Wi of the light beam 816 entering the beam expander 901.

The surface 902 of the grating 921 is made of a material that reflects and diffracts the wavelengths of the light beam 816. Each of the prisms 922, 923, 924, and 925 is a prism that acts to disperse and redirect the light beam 816 as it passes through the body of the prism. Each of the prisms 922, 923, 924, and 925 is made of a material that transmits the wavelengths in the light beam 816. For example, if the light beam 816 is in the DUV range, the prisms 922, 923, 924, and 925 are made of a material (such as, for example, calcium fluoride) that transmits light in the DUV range.

The prism 925 is positioned farthest from the grating 921, and the prism 922 is positioned closest to the grating 921. The light beam 816 enters the spectral adjustment apparatus through an aperture 955, and then travels through the prism 925, the prism 924, the prism 923, and the prism 922 (in that order). With each passing of the light beam 816 through a consecutive prism 925, 924, 923, 922, the light beam 816 is optically magnified and redirected (refracted at an angle) toward the next optical component. After passing through the prisms 925, 924, 923, and 922, the light beam 816 reflects off the surface 902. The light beam 816 then passes through the prism 922, the prism 923, the prism 924, and the prism 925 (in that order). With each passing through the consecutive prisms 922, 923, 924, 925, the light beam 816 is optically compressed as it travels toward the aperture 955. After passing through the prisms 922, 923, 924, and 925, the light beam 816 exits the spectral adjustment apparatus 995 through the aperture 955. After exiting the spectral adjustment apparatus 995, the light beam 816 passes through the chamber 215-1 and a portion of the beam reflects off of the output coupler 296-1 to return to the chamber 215-1 and the spectral adjustment apparatus 995.

Figure 9B:
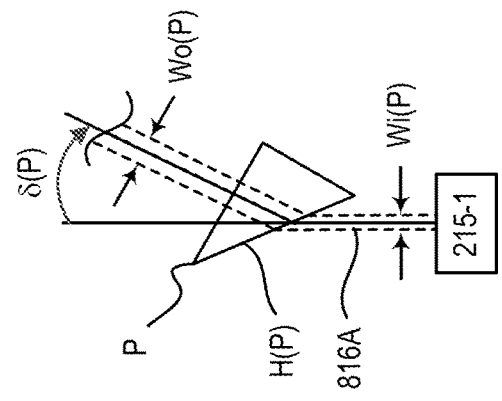

The spectral property of the light beam 816 may be adjusted by changing the relative orientations of the optical components 921, 922, 923, 924, and/or 925. Referring to FIG. 9B, the rotation of a prism P (which can be any one of prisms 922, 923, 924, or 925) about an axis that is perpendicular to the plane of the page changes an angle of incidence at which the light beam 816 impinges upon the entrance surface H(P) of that rotated prism P. Moreover, two local optical qualities, namely, an optical magnification OM(P) and a beam refraction angle δ(P), of the light beam 816 through that rotated prism P are functions of the angle of incidence of the light beam 816 impinging upon the entrance surface H(P) of that rotated prism P. The optical magnification OM(P) of the light beam 816 through the prism P is the ratio of a transverse width Wo(P) of the light beam 816A exiting that prism P to a transverse width Wi(P) of the light beam 816 entering that prism P.

A change in the local optical magnification OM(P) of the light beam 816 at one or more of the prisms P within the beam expander 901 causes an overall change in the optical magnification OM 965 of the light beam 816 through the beam expander 901. Additionally, a change in the local beam refraction angle δ(P) through one or more of the prisms P within the beam expander 901 causes an overall change in an angle of incidence 962 (FIG. 9A) of the light beam 816A at the surface 902 of the grating 921. The wavelength of the light beam 816 may be adjusted by changing the angle of incidence 962 (FIG. 9A) at which the light beam 816 impinges upon the surface 902 of the grating 921. The spectral bandwidth of the light beam 816 may be adjusted by changing the optical magnification 965 of the light beam 816.

Accordingly, the spectral properties of the light beam 816 may be changed or adjusted by controlling the orientation of the grating 921 and/or one or more of the prisms 922, 923, 924, 925 via the respective actuators 921A, 922A, 923A, 924A, 925A. Other implementations of the spectral adjustment apparatus are possible.

Referring again to FIG. 8, the spectral properties of the light beam 816 may be adjusted in other ways in addition to or instead of the spectral adjustment apparatus 895. Thus, other components of the optical source apparatus 810 may perform the function of the spectral adjustment apparatus 895. For example, the spectral properties, such as the spectral bandwidth and center wavelength, of the light beam 816 may be adjusted by controlling a pressure and/or gas concentration of the gaseous gain medium of the chamber 215-1. For implementations in which the optical source apparatus 810 is an excimer source, the spectral properties (for example, the spectral bandwidth or the center wavelength) of the light beam 816 may be adjusted by controlling the pressure and/or concentration of, for example, fluorine, chlorine, argon, krypton, xenon, and/or helium in the chamber 215-1.

The pressure and/or concentration of the gaseous gain medium 819 is controllable with a gas supply system 890. The gas supply system 890 is fluidly coupled to an interior of the discharge chamber 815 via a fluid conduit 889. The fluid conduit 889 is any conduit that is capable of transporting a gas or other fluid with no or minimal loss of the fluid. For example, the fluid conduit 889 may be a pipe that is made of or coated with a material that does not react with the fluid or fluids transported in the fluid conduit 889. The gas supply system 890 includes a chamber 891 that contains and/or is configured to receive a supply of the gas or gasses used in the gain medium 819. The gas supply system 890 also includes devices (such as pumps, valves, and/or fluid switches) that enable the gas supply system 890 to remove gas from or inject gas into the discharge chamber 815. The gas supply system 890 is coupled to the control system 250.

Figure 10:
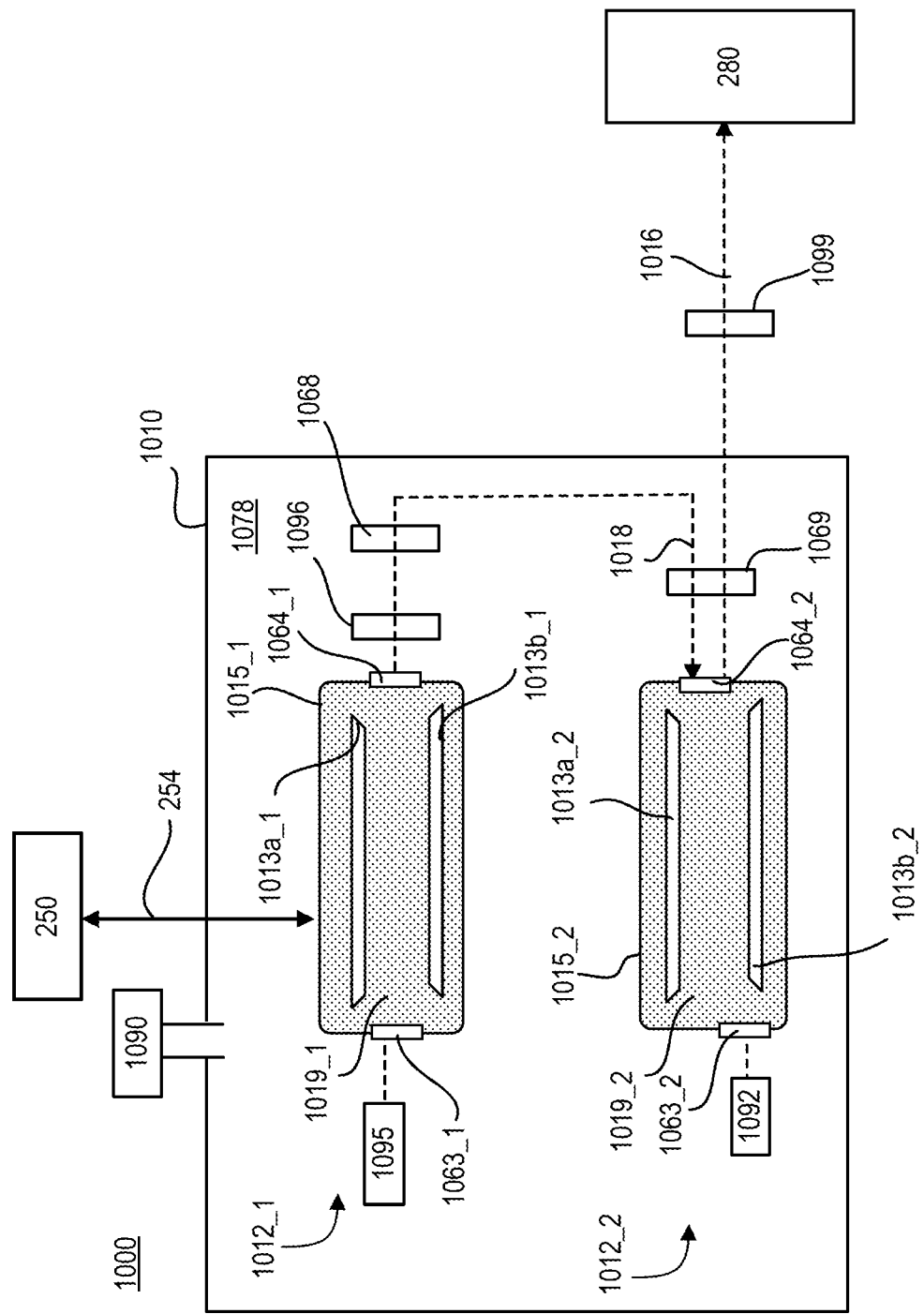

FIG. 10 shows another example configuration of a DUV system. FIG. 10 is a block diagram of a photolithography system 1000 that includes an optical source apparatus 1010 that produces a pulsed light beam 1016, which is provided to the scanner apparatus 280. The photolithography system 1000 also includes the control system 250. The control system 250 is coupled to a master oscillator 1012_1 of the optical source apparatus 1010. In some implementations, the control system 250 is also coupled to and the scanner apparatus 280.

The optical source apparatus 1010 is a two-stage laser system that includes the master oscillator (MO) 1012_1, which provides the seed light beam 1018 to a power amplifier (PA) 1012_2. The PA 1012_2 receives the seed light beam 1018 from the MO 1012_1 and amplifies the seed light beam 1018 to generate the light beam 1016 for use in the scanner apparatus 280. For example, in some implementations, the MO 1012_1 may emit a pulsed seed light beam, with seed pulse energies of approximately 1 milliJoule (mJ) per pulse, and these seed pulses may be amplified by the PA 1012_2 to about 10 to 15 mJ.

The MO 1012_1 includes a discharge chamber 1015_1 having two elongated electrodes 1013a_1 and 1013b_1, a gain medium 1019_1 that is a gas mixture, and a fan (not shown) for circulating the gas mixture between the electrodes 1013a_1, 1013b_1. A resonator is formed between a line narrowing module 1095 on one side of the discharge chamber 1015_1 and an output coupler 1096 on a second side of the discharge chamber 1015_1.

The discharge chamber 1015_1 includes a first chamber window 1063_1 and a second chamber window 1064_1. The first and second chamber windows 1063_1 and 1064_1 are on opposite sides of the discharge chamber 1015_1. The first and second chamber windows 1063_1 and 1064_1 transmit light in the DUV range and allow DUV light to enter and exit the discharge chamber 1015_1.

The line narrowing module 1095 may include an optical element such as a grating or a prism (such as shown in FIG. 9A) that finely tunes the spectral output of the discharge chamber 1015_1. The optical source apparatus 1010 also includes a line center analysis module 1068 that receives an output light beam from the output coupler 1096 and a beam coupling optical system 1069. The line center analysis module 1068 is a measurement system that may be used to measure or monitor the wavelength of the seed light beam 1018. The line center analysis module 1068 may be placed at other locations in the optical source apparatus 1010, or it may be placed at the output of the optical source apparatus 1010.

The gas mixture that is the gain medium 1019_1 may be any gas suitable for producing a light beam at the wavelength and bandwidth required for the application. For an excimer source, the gas mixture may contain a noble gas (rare gas) such as, for example, argon or krypton, a halogen, such as, for example, fluorine or chlorine and traces of xenon apart from a buffer gas, such as helium. Specific examples of the gas mixture include argon fluoride (ArF), which emits light at a wavelength of about 193 nm, krypton fluoride (KrF), which emits light at a wavelength of about 248 nm, or xenon chloride (XeCl), which emits light at a wavelength of about 351 nm. Thus, the light beams 1016 and 1018 include wavelengths in the DUV range in this implementation. The excimer gain medium (the gas mixture) is pumped with short (for example, nanosecond) current pulses in a high-voltage electric discharge by application of a voltage to the elongated electrodes 1013a_1, 1013b_1.

The PA 1012_2 includes a beam coupling optical system 1069 that receives the seed light beam 1018 from the MO 1012_1 and directs the seed light beam 1018 through a discharge chamber 1015_2, and to a beam turning optical element 1092, which modifies or changes the direction of the seed light beam 1018 so that it is sent back into the discharge chamber 1015_2. The beam turning optical element 1092 and the beam coupling optical system 1069 form a circulating and closed loop optical path in which the input into a ring amplifier intersects the output of the ring amplifier at the beam coupling optical system 1069.

The discharge chamber 1015_2 includes a pair of elongated electrodes 1013a_2, 1013b_2, a gain medium 1019_2, and a fan (not shown) for circulating the gain medium 1019_2 between the electrodes 1013a_2, 1013b_2. The gas mixture that forms the gain medium 1019_2 may be the same as the gas mixture that forms gain medium 1019_1.

The discharge chamber 1015_2 includes a first chamber window 1063_2 and a second chamber window 1064_2. The first and second chamber windows 1063_2 and 1064_2 are on opposite sides of the discharge chamber 1015_2. The first and second chamber windows 1063_2 and 1064_2 transmit light in the DUV range and allow DUV light to enter and exit the discharge chamber 1015_2.

When the gain medium 1019_1 or 1019_2 is pumped by applying voltage to the electrodes 1013a_1, 1013b_1 or 1013a_2, 1013b_2, respectively, the gain medium 1019_1 and/or 1019_2 emits light. When voltage is applied to the electrodes at regular temporal intervals, the light beam 1016 is pulsed. Thus, the repetition rate of the pulsed light beam 1016 is determined by the rate at which voltage is applied to the electrodes. The repetition rate of the pulses may range between about 500 and 6,000 Hz for various applications. In some implementations, the repetition rate may be greater than 6,000 Hz, and may be, for example, 12,000 Hz or greater, but other repetition rates may be used in other implementations.

The output light beam 1016 may be directed through a beam preparation system 1099 prior to reaching the scanner apparatus 280. The beam preparation system 1099 may include a bandwidth analysis module that measures various parameters (such as the bandwidth or the wavelength) of the beam 1016. The beam preparation system 1099 also may include a pulse stretcher that stretches each pulse of the output light beam 1016 in time. The beam preparation system 1099 also may include other components that are able to act upon the beam 1016 such as, for example, reflective and/or refractive optical elements (such as, for example, lenses and mirrors), filters, and optical apertures (including automated shutters).

The DUV optical source apparatus 1010 also includes the gas management system 1090, which is in fluid communication with an interior 1078 of the DUV optical source apparatus 1010.

Figure 11A:
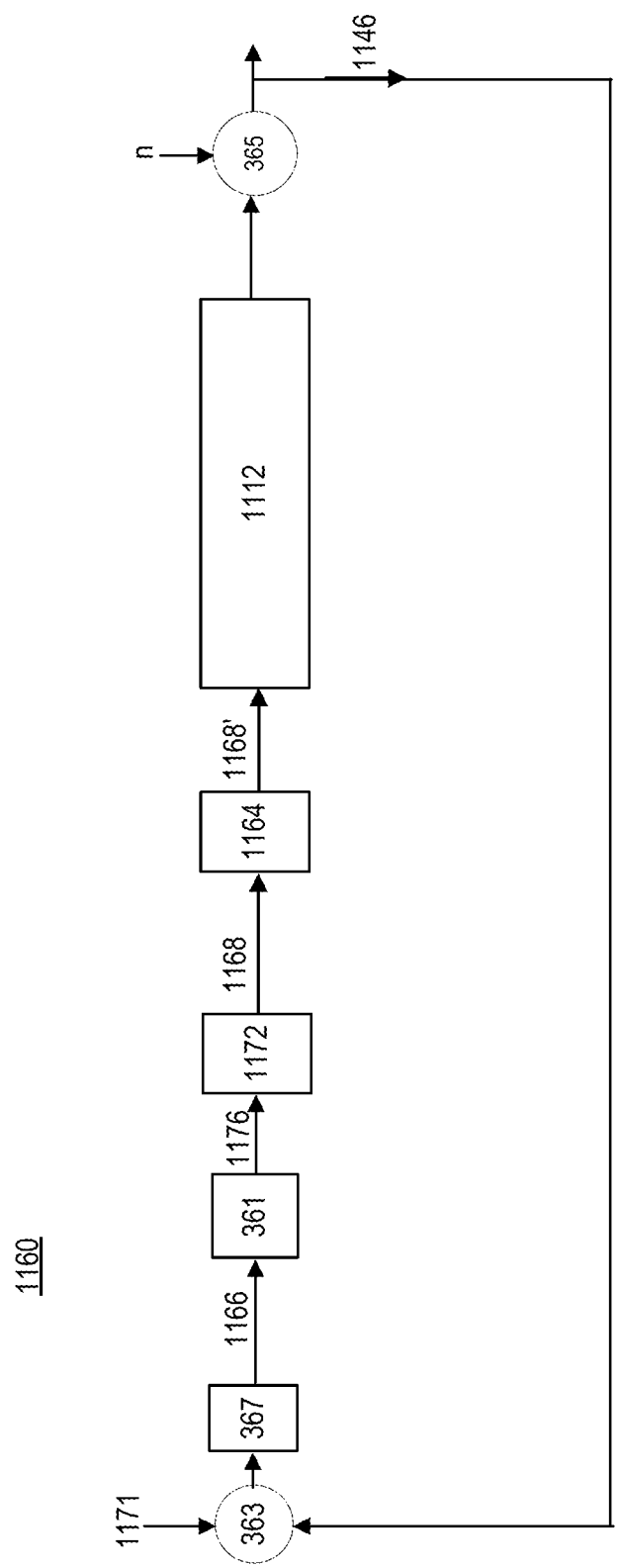
FIGS. 11A, 12A, and 12B are block diagrams that relate to examples of an energy control module.

FIG. 11A is a block diagram of an energy control module 1160. The energy control module 1160 is similar to the energy control module 360 (FIG. 3A), except the energy control module 1160 does not include the oscillator selector module 362, and the energy control module 1160 includes a correction module 1164 instead of the correction module 364. The energy control module 1160 also includes a servo control module 1172. The energy control module 1160 is an implementation of the energy control module 360 that is configured for use with a single optical oscillator 1112. The energy control module 1160 may be implemented as part of the control system 150 or the control system 250. The single optical oscillator 1112 may be the only optical oscillator in a larger system (such as the system 800), the single optical oscillator 1112 may be one of two or more optical oscillators in a staged system (such as the system 1000), or the optical oscillator 1112 may be one of N optical oscillators in a system such as the system 100. The output of the optical oscillator 1112 is a light beam such as the light beam 816.

The energy control module 1160 includes the first comparator 363, the delay module 367, the excitation determination module 361, and the second comparator 365. These components are discussed in detail with respect to FIG. 3A. The first comparator 363 determines an error signal 1166 based on a comparison between an energy property signal 1146 (which is the energy in the previous pulse) and an energy target 1171. The error signal 1166 is provided to the excitation determination module 361, which determines a voltage error 1176. The voltage error 1176 is provided to the servo control module 1172, which determines the excitation signal 1168. The voltage command 1176 (or Vservo) is determined using Equation (13):

$$Vservo(k+1) = Vservo(k) + \frac{K_E e(k) + K_H D(k)}{dEdV(k)}, \quad \text{Equation (13)}$$

where k is an integer number that indexes the pulse number, e(k) is the energy error 1166 for the kth pulse, D (k) is the cumulative energy error or dose error for the kth pulse, $K_E$ is a tuning parameter or gain related to the energy error, $K_H$ is a tuning parameter or gain related to the dose error, and dEdV(k) is the transfer function of the optical oscillator 1112 when it produces the kth pulse.

The energy control module 1160 also includes the correction module 1164, which implements the notch filter expressed in Equation (14):

$$V_{sp}(k+1) = -\frac{1+2*G_N}{1+G_N}V_{sp}(k) + \frac{1-G_N}{1+G_N}V_{sp}(k-1) + \frac{1}{1+G_N}V_{sp}(k-2) + V_{servo}(k) - \frac{1}{1+G_N}V_{servo}(k-2), \quad \text{Equation (14)}$$

where $G_N$ is $K_H/K_E$, k is an integer number that indexes the pulse number, and Vsp (k+1) is the corrected excitation signal 1168' for the k+1th pulse.

In the energy control module 1160, the correction module 1164 corrects the excitation signal 1168 to account for the variation in the transfer function of the optical oscillator 1112. The transfer function varies because the spectral properties of the pulses in the output light beam 816 are intentionally not all the same. For example, the center wavelength of each pulse may change on a pulse-by-pulse bases changing the configuration of the spectral adjustment apparatus 895 prior to producing the pulse. The center wavelength may alternate between two values (a first wavelength and a second wavelength) to form a pulsed light beam that has a spectral peak at the first wavelength and a spectral peak at the second wavelength, where the peaks are separated from each other by a spectral distance that is the difference between the first wavelength and the second wavelength. There is little to no light in the pulsed light beam at wavelengths between the first wavelength and the second wavelength.

The corrected excitation signal 1168' is applied to the optical oscillator 1112 to correct for the variation of the efficiency of the optical oscillator 1112. By correcting the excitation signal 1168', the energy control module 1160 causes the energy of the pulses in the pulsed light beam 816 to be substantially constant at the target energy or within an acceptable difference of the target energy even though the center wavelength is not constant.

Figure 11B:
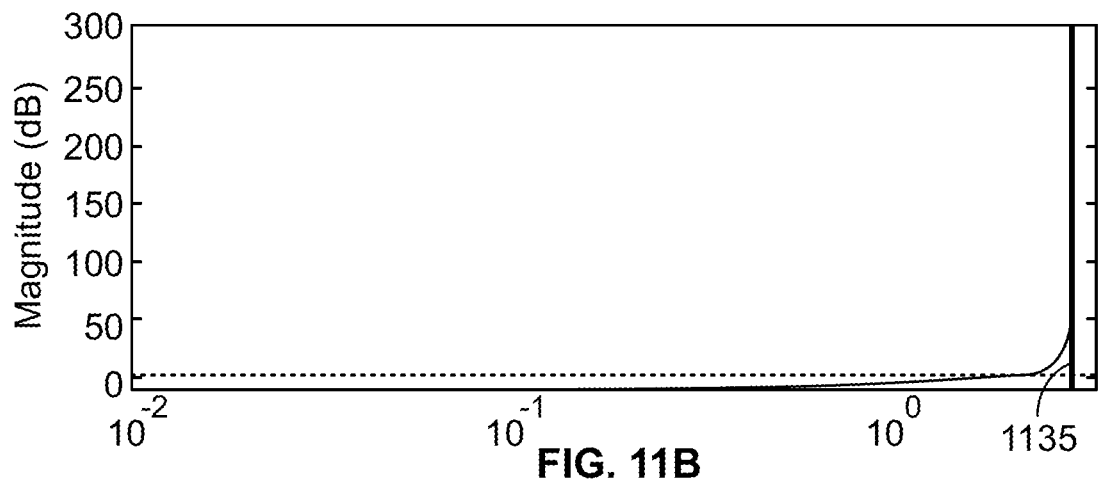
FIGS. 11B and 11C relate to an example of a notch filter.
Figure 11C:
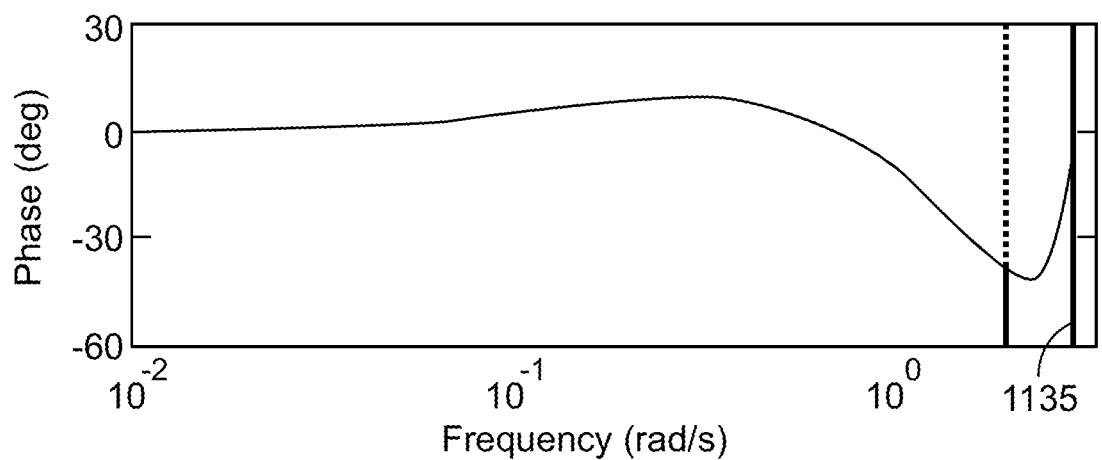

FIGS. 11B and 11C are plots of an example of a notch filter implemented based on Equation 14. FIG. 11B shows the magnitude of the notch filter as a function of frequency and FIG. 11C shows the phase of the notch filter as a function of frequency. The notch filter has the greatest magnitude at the Nyquist frequency 1135 (half the repetition rate of the light produced by the optical oscillator 1112). As a result, the closed loop sensitivity of the combined controller (the servo control module 1172 and the correction module 1164) is suppressed (has very low magnitude) at Nyquist frequency and hence the energy disturbance at the Nyquist Frequency is suppressed by the notch filter.

Figure 11D:
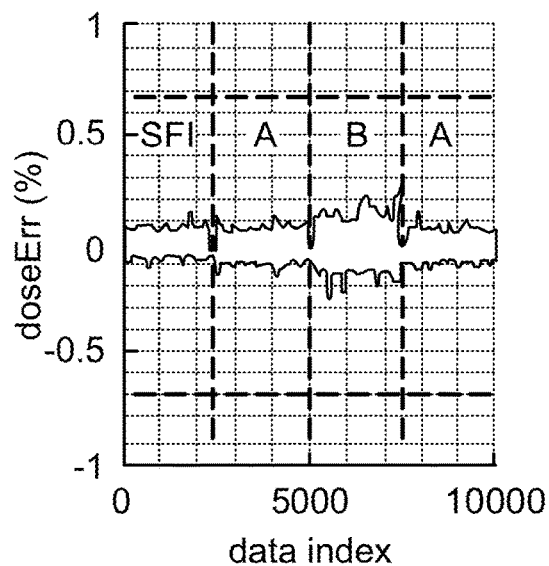
FIGS. 11D-11F are examples of measured data.
Figure 11E:
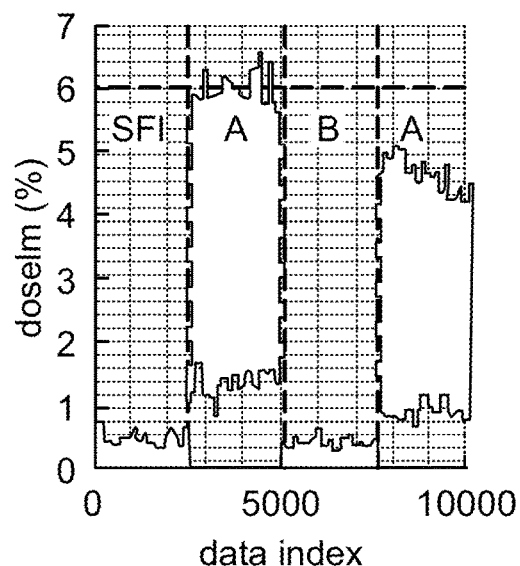
Figure 11F:
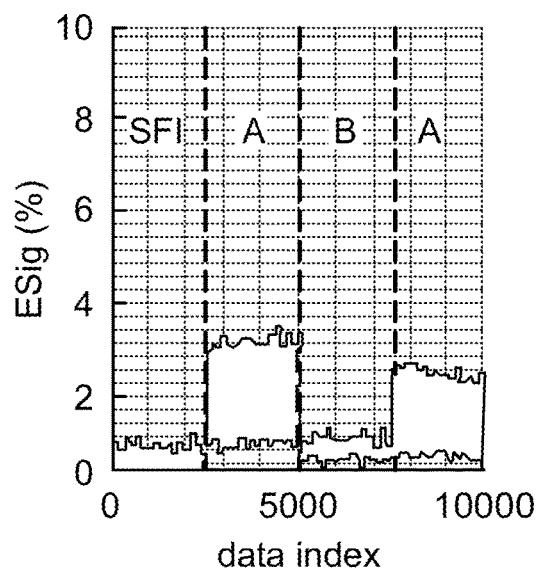

FIGS. 11D-11F show examples of measured results. The x axis is the same in each of FIGS. 11D-11F. FIG. 11D shows dose error (%) as a function of pulse number. FIG. 11E shows dose variation in two wavelengths or dose imbalance (%) as a function of the pulse number. FIG. 11F shows the energy variation or energy sigma (%) as a function of the pulse number. The first quarter of the pulses (labeled SFI) were produced in the Single Focal Imaging (SFI) mode. In the SFI mode, the nominal center wavelength of the pulses remains constant pulse-to-pulse and is not intentionally changed. The second quarter and the fourth quarters of the pulses (labeled A) were produced in the Multi Focal Imaging (MFI) mode with a legacy controller that did not include a notch filter and did not use the energy control module 1160. In the MFI mode, the center wavelength is changed on a pulse-to-pulse basis. The third quarter of the pulses (labeled B) were produced in the MFI mode with the energy control module 1160. As shown, the energy control module 1160 improved the performance of the dose variation (FIG. 11E) and the energy variation (FIG. 11F). The dose error (FIG. 11D) is slightly degraded when using the energy control module 1160 due to the effect of the notch filter on lower frequencies. However, the dose error is well within specification and the improvements of the dose variation and energy variation outweigh the small degradation in the dose error.

Figure 12A:
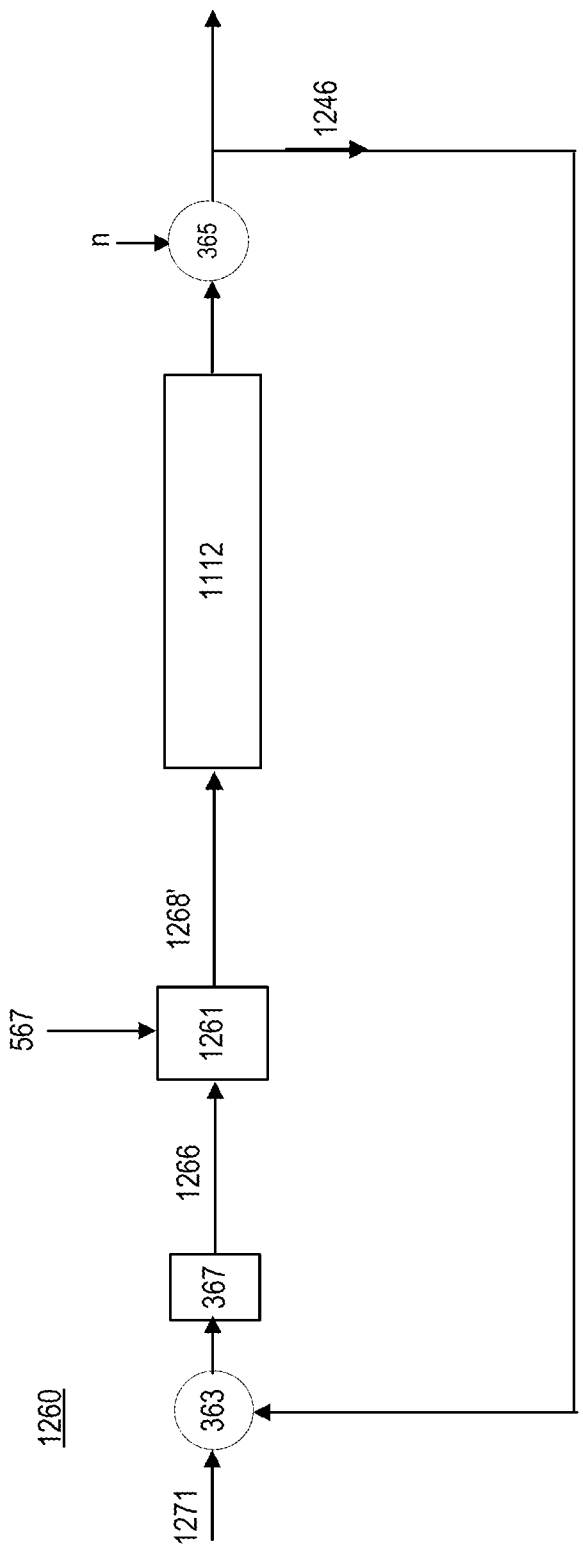

FIG. 12A is a block diagram of an energy control module 1260. The energy control module 1260 uses a feed-forward approach to reject or reduce pulse-to-pulse energy disturbances or energy variations that occur due to intentionally changing the configuration of the spectral adjustment apparatus 895 to vary the spectral properties of the light beam produced by the optical oscillator 1112. The energy control module 1260 is similar to the energy control module 560 (FIG. 5A), except the energy control module 1260 does not include the oscillator selection module 362. The energy control module 1260 may be implemented as part of the control system 150 or the control system 250. The energy control module 1260 is an implementation of the energy control module 260 that is configured for use with the single optical oscillator 1112.

The energy correction module 1260 includes the delay module 367 and an excitation determination module 1261. The output of the delay module 367 is an energy error 1266, which is a measure of the difference between an energy property signal 1246 (which is the energy in the previous pulse) and an energy target 1271. The excitation determination module 1261 determines a corrected excitation signal 1268' and provides the corrected excitation signal 1268' to the optical oscillator 1112.

Figure 12B:
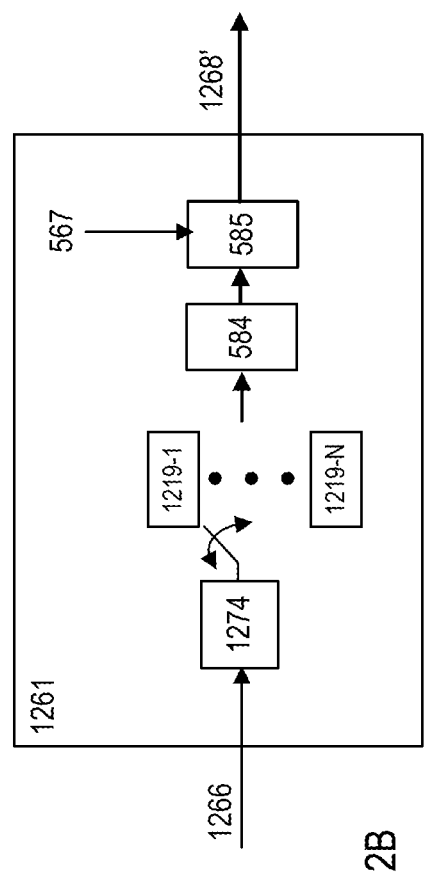

FIG. 12B is a block diagram of the excitation module 1261. The excitation determination module 1261 may include the feedback controller 587, which is not shown in FIG. 12B but is discussed above and shown in FIG. 5B. The excitation determination module 1261 includes a transfer function selector 1274, which selects one transfer function 1219_1 to 1219_N. Each of the transfer functions 1219_1 to 1219_N is a transfer function of the optical oscillator 1112 for a particular wavelength, and each of the transfer functions 1219_1 to 1219_N is associated with a particular configuration of the spectral adjustment apparatus 895. The spectral selection apparatus 895 has N different configurations, each of which is associated with a different spectral parameter (for example, center wavelength or bandwidth) of the output light beam 816. N is an integer number that is greater than zero and indexes all of the possible configurations of the spectral adjustment apparatus 895 that are relevant to the particular application. Each of the N configurations of the spectral adjustment apparatus 895 is associated with a respective transfer function 1219_1 to 1219_N of the optical oscillator 812. For example, the index value of N associated with a particular one of the transfer functions 1219_1 to 1219_N may be stored in a look-up table or database with data that defines the transfer function and a center wavelength produced by that configuration of the spectral adjustment apparatus 895. The transfer functions 1219_1 to 1219_N may be stored on the electronic storage 252 in association with one of the N configurations of the spectral adjustment apparatus 895. The transfer functions 1219_1 to 1219_N may be associated with the N configurations by the manufacturer, or may be provided by the operator of the system 800.

The transfer function selector 1274 determines which of the transfer functions 1219_1 to 1219_N is associated with the configuration that produces the kth pulse of the output light beam emitted from the optical oscillator 1112. The transfer function selector 1274 may select from among the transfer functions 1219_1 to 1219_N by implementing a remainder function, similar to the remainder function discussed with respect to FIG. 3A, where M is an integer number that represents the number of the N configurations of the spectral adjustment apparatus 895 that are alternated between or cycled through to produce optical pulses. In another example, the center wavelength of optical pulses produced by the optical oscillator 1112 varies pulse-by-pulse according to a pre-determined recipe. For example, the optical oscillator 1112 and the spectral adjustment apparatus 895 may be controlled such that the center wavelength cycles among four pre-determined wavelengths in a sequential manner Thus, the transfer function selector 1274 selects the transfer function 1219_2 for the second and sixth pulses, the transfer function 1219_3 for the third and seventh pulses, and so on.

The error signal 1266 is provided to the selected transfer function, and the output of the selected transfer function is provided to the gain 584 and then to the integrator 585. The feed-forward correction signal 567 is provided to the integrator 585. The feed-forward correction signal 567 removes, reduces, or rejects energy disturbances such as those illustrated in FIG. 7B. The signal 567 corrects for the energy differences caused by changing the configuration of the spectral adjustment apparatus 895 during operation of the optical oscillator 1112 and determines a corrected excitation signal 1268'. The corrected excitation signal 1268' (V(k)) is determined based on Equation (15):

$$V(k+1) = V^*(k) + \frac{dedv(\lambda_k)}{dedv(\lambda_{k+1})}(V(k+1) - V^*(k)) + \frac{E^*(\lambda_k) - E^*(\lambda_{k+1})}{dedv(\lambda_{k+1})}, \quad \text{Equation (15)}$$

where k is an integer that is greater than or equal to 1 and represents the pulse number of a pulse in the light beam output by the optical oscillator 1112, is the wavelength of the kth pulse produced by the optical oscillator, E is an energy value, V is a voltage value, and $dedv(\lambda_k)$ is the transfer function 1219_1 to 1219_N of the optical oscillator that corresponds to producing the wavelength in the kth pulse. V* and E* are moving averages of raw voltage and energy values, respectively.

FIGS. 12C-12F show examples of simulated data. FIGS. 12C and 12D relate to a legacy system operating in MFI mode, where the legacy system does not include the energy control module 1260. FIGS. 12E and 12F relate to a system operating in MFI mode, where the system includes the energy control module 1260. FIGS. 12C and 12E show pulse energy as a function of pulse number. As shown in FIG. 12E, the system with the energy control module 1260 maintains a constant pulse energy even though the center wavelength of the pulses is not constant. On the other hand, the pulse energy produced by the legacy system (FIG. 12C) oscillates at the Nyquist frequency.

FIGS. 12D and 12F show dose imbalance as a function of pulse number. The dose imbalance is much less for the system that includes the energy control module 1260.

These and other implementations are within the scope of the claims. For example, the energy control module 460 may be implemented in a system in which a single optical oscillator (such as the optical oscillator 111) is operated in a manner such that the center wavelength of the pulses produced by the optical oscillator intentionally changes on a pulse-to-pulse basis. In implementations in which the energy control module 460 is used with a single optical oscillator, the an oscillator selection module 362 is not used. Moreover, the transfer functions 1219_1 to 1219_N are used instead of the models 475-1 to 475-N.

Other aspects of the invention are set out in the following numbered clauses.

1. A system for deep ultraviolet (DUV) optical lithography, the system comprising: an optical source apparatus comprising N optical oscillators, wherein N is an integer number greater than or equal to two, and each of the N optical oscillators is configured to produce a pulse of light in response to an excitation signal; and a control system coupled to the optical source apparatus, the control system configured to determine a corrected excitation signal for a first one of the N optical oscillators based on an input signal, the input signal comprising an energy property of a pulse of light produced by another one of the N optical oscillators.

2. The system of clause 1, wherein the control system being configured to determine the corrected excitation signal comprises the control system being configured to apply a filter to the input signal to produce a filtered input signal, and the excitation signal is the filtered input signal.

3. The system of clause 2, wherein the filter comprises a notch filter that transmits information having a frequency in a first frequency band and substantially blocks information having a frequency outside the first frequency band.

4. The system of clause 3, wherein the optical source apparatus produces an exposure light beam, each of the N optical oscillators emits a pulse of light at a repetition rate, all of the N optical oscillators have the same repetition rate, and the exposure light beam comprises pulses of light from each of the N optical oscillators separated in time from each other.

5. The system of clause 3, wherein the filter produces an output based on the input signal and an energy error value, and the control system is configured to determine the corrected input signal based on the output of the filter and the initial input signal.

6. The system of clause 5, wherein the filter comprises a Kalman filter.

7. The system of clause 3, wherein the control system is further configured to apply a feed-forward correction to the initial input signal prior to determining the corrected input signal.

8. The system of clause 7, wherein the feed-forward correction signal is determined based on a first modelled relationship between an energy of a produced pulse of light and an excitation quantity for the first one of the N optical amplifiers and a second modelled relationship between an energy of a produced pulse of light and an excitation quantity for the second one of the N optical amplifiers.

9. The system of clause 8, wherein the excitation mechanism in each of the N optical oscillators comprises a set of electrodes, the first modelled relationship comprises a linear relationship that relates an amount of voltage applied to the electrodes in the first one of the N optical amplifiers to the energy of the produced pulse of light, and the second modelled relationship comprises a linear relationship that relates an amount of voltage applied to the electrodes in the first one of the N optical amplifiers to the energy of the produced pulse of light.

10. The system of clause 9, further comprising a scanner apparatus configured to receive an exposure light beam from the optical source apparatus, and wherein the control system is implemented as part of the scanner apparatus such that the scanner apparatus provides the corrected excitation signal to the first one of the N optical oscillators.

11. The system of clause 1, further comprising: a beam combiner configured to: receive pulses of light from any of the N optical oscillators and to direct the received pulses of light toward a scanner apparatus as an exposure light beam.

12. The system of clause 11, wherein the energy property comprises a metric based on an optical energy measurement obtained in the scanner apparatus.

13. The system of clause 1, wherein the energy property comprises an energy error.

14. The system of clause 1, wherein the pulse of light produced by the other one of the N optical oscillators is a first pulse of light in an exposure light beam, the pulse of light formed by the first one of the N optical oscillators in response to application of the excitation signal is a second pulse in the exposure light beam, and the second pulse and the first pulse are consecutive pulses.

15. A method for a deep ultraviolet (DUV) optical lithography system, the method comprising:
determining an energy error based on an amount of energy in a pulse of light emitted from a first one of N optical oscillators and received by a scanner apparatus, wherein N is an integer number that is equal to or greater than two, and the energy error is a difference between the amount of energy in the pulse of light and a target energy;
receiving an initial input signal, the initial input signal being based on the energy error; determining a corrected input signal based on the initial input signal; and applying the corrected input signal to an excitation mechanism of a second one of the N optical oscillators.

16. The method of clause 15, wherein determining the corrected input signal based on the initial input signal comprises filtering the initial input signal.

17. The method of clause 16, wherein filtering the initial input signal comprises applying a notch filter to the initial input signal.

18. The method of clause 16, wherein filtering initial input signal comprises providing the initial input signal and the energy error to a Kalman filter.

19. The method of clause 16, wherein filtering the initial input signal comprises applying a feed-forward correction to the initial input signal.

20. The method of clause 16, wherein the initial input signal is received from a scanner apparatus configured to receive an exposure light beam generated by more than one of the N optical oscillators.

21. A system comprising:
an optical source apparatus comprising:
an optical oscillator configured to produce a pulse of light in response to an excitation signal; and
a spectral adjustment apparatus configured to control a spectral property of the pulse of light; and
a control system coupled to the optical source apparatus, the control system configured to determine a corrected excitation signal that adjusts an energy of a subsequently produced pulse of light to account for a change in the configuration of the spectral adjustment apparatus.

22. The system of clause 21, wherein the optical oscillator is associated with a plurality of transfer functions, each transfer function being associated with a particular configuration of the spectral adjustment apparatus, and the control system is configured to determine the corrected excitation signal based on the transfer function associated with the particular configuration of the spectral adjustment apparatus used to produce the subsequent pulse of light.

23. The system of clause 22, wherein the spectral adjustment apparatus comprises at least one prism, and each transfer function is associated with a different position of the at least one prism.

24. The system of clause 23, wherein the spectral property comprises a center wavelength of the pulse of light.

25. The system of clause 21, wherein each configuration of the spectral adjustment apparatus is associated with a particular value of the spectral property.

26. The system of clause 25, wherein each configuration of the spectral adjustment apparatus is associated with a particular value of a center wavelength and a bandwidth of the pulse of light.

27. The system of clause 21, wherein the optical source apparatus further comprises a power amplifier that receives a seed light beam from the optical oscillator, and the system is configured for use in a deep ultraviolet (DUV) lithography system.

28. A method comprising:
providing a first excitation signal to an optical oscillator associated with a spectral adjustment apparatus in a first configuration state to generate a first pulse of light having a first value of a spectral property;
adjusting the spectral adjustment apparatus to a second configuration state;
determining a corrected excitation signal based on an energy property of the first pulse of light and a transfer function of the optical oscillator when the spectral adjustment apparatus is in the second configuration state; and
providing the corrected excitation signal to the optical oscillator while the spectral adjustment apparatus is in the second configuration state to generate a second pulse of light having a second value of the spectral property.

29. The method of clause 28, wherein the second pulse of light has a second value of the energy property, and the second value is substantially equal to the first value of the energy property.

30. A method of controlling an optical source apparatus to generate a pulsed light beam that has at least two spectral peaks separated by a spectral distance, the method comprising:
generating a first pulse of light from the optical source apparatus, the first pulse of light having a first wavelength and a first value of an energy property;
adjusting at least one component of the optical source apparatus, the at least one component being configured to control a spectral property of light emitted from the optical source apparatus;
determining a corrected excitation signal; and
applying the corrected excitation signal to the optical source apparatus after adjusting the at least one component to generate a second pulse of light from the optical source apparatus, the second pulse of light having a second wavelength and the first value of the energy property, wherein the pulsed light beam comprises at least the first pulse of light and the second pulse of light, and the spectral distance is a difference between the first wavelength and the second wavelength.

31. The method of clause 30, wherein the optical source apparatus comprises only one optical oscillator, and adjusting the at least one component of the optical source apparatus comprises adjusting a spectral adjustment apparatus of the one optical oscillator from a first configuration state to a second configuration state;
the one optical oscillator is associated with a plurality of transfer functions, each of the transfer functions corresponding to a particular configuration state of the spectral adjustment apparatus; and
the corrected excitation signal is determined based on the transfer function that corresponds to the second configuration state of the spectral adjustment apparatus.

32. The method of clause 31, wherein adjusting the spectral adjustment apparatus comprises actuating a dispersive optical element.

33. The method of clause 30, wherein the optical source apparatus comprises N optical oscillators, each associated with a transfer function that relates excitation energy and produced energy, and a first one of the N optical oscillators produces the first pulse of light; adjusting the at least one component of the optical source apparatus comprises switching from the first one of the N optical oscillators to a second one of the N optical oscillators such that the second one of the N optical oscillators produces the second pulse of light; and the corrected excitation signal is determined based on the transfer function of the second one of the N optical oscillators.

34. A control module for an optical source apparatus, the control module configured to: cause the optical source apparatus to generate a first pulse of light from the optical source apparatus, the first pulse of light having a first wavelength and a first value of an energy property;
adjust at least one component of the optical source apparatus, the at least one component being configured to control a spectral property of light emitted from the optical source apparatus;
determine a corrected excitation signal; and
apply the corrected excitation signal to the optical source apparatus after the at least one component to generate a second pulse of light from the optical source apparatus is adjusted, the second pulse of light having a second wavelength and the first value of the energy property, wherein the pulsed light beam comprises at least the first pulse of light and the second pulse of light, and the spectral distance is a difference between the first wavelength and the second wavelength.

The breadth and scope of the present disclosure should not be limited by any of the above-described exemplary embodiments, but should be defined only in accordance with the following claims and their equivalents.

What is claimed is:

1. A system for deep ultraviolet (DUV) optical lithography, the system comprising:
    an optical source apparatus comprising N optical oscillators, wherein N is an integer number greater than or equal to two, and each of the N optical oscillators is configured to produce a pulse of light in response to an excitation signal; and
    a control system coupled to the optical source apparatus, the control system configured to determine a corrected excitation signal for a first one of the N optical oscillators based on an input signal and an efficiency transfer function, the input signal comprising an energy property of a pulse of light produced by a second one of the N optical oscillators and the efficiency transfer function being associated with the second one of the N optical oscillators, wherein the efficiency transfer function relates excitation of the second one of the N optical oscillators with optical output of the second one of the N optical oscillators.

2. The system of claim 1, wherein the control system being configured to determine the corrected excitation signal comprises the control system being configured to apply a filter to the input signal to produce a filtered input signal, and the corrected excitation signal is determined based on the filtered input signal and the efficiency transfer function.

3. The system of claim 2, wherein the filter comprises a notch filter that transmits information having a frequency in a first frequency band and substantially blocks information having a frequency outside the first frequency band.

4. The system of claim 3, wherein the filter produces an output based on the input signal and an energy error value, and the control system is configured to determine the corrected excitation signal based on the output of the filter and an initial input signal.

5. The system of claim 3, wherein the control system is further configured to apply a feed-forward correction to an initial input signal prior to determining the corrected excitation signal.

6. The system of claim 5, wherein the feed-forward correction signal is determined based on a first modelled relationship between an energy of a produced pulse of light and an excitation quantity for the first one of the N optical amplifiers and a second modelled relationship between an energy of a produced pulse of light and an excitation quantity for the second one of the N optical amplifiers.

7. The system of claim 6, wherein the excitation mechanism in each of the N optical oscillators comprises a set of electrodes, the first modelled relationship comprises a linear relationship that relates an amount of voltage applied to the electrodes in the first one of the N optical amplifiers to the energy of the produced pulse of light, and the second modelled relationship comprises a linear relationship that relates an amount of voltage applied to the electrodes in the first one of the N optical amplifiers to the energy of the produced pulse of light.

8. The system of claim 1, wherein the energy property comprises an energy error.

9. A method for a deep ultraviolet (DUV) optical lithography system, the method comprising:
    determining an energy error based on an amount of energy in a pulse of light emitted from a first one of N optical oscillators and received by a scanner apparatus, wherein N is an integer number that is equal to or greater than two, and the energy error is a difference between the amount of energy in the pulse of light and a target energy;
    receiving an initial input signal, the initial input signal being based on the energy error;
    determining a corrected input signal based on the initial input signal and an efficiency transfer function of the first one of the N optical oscillators; and
    applying the corrected input signal to an excitation mechanism of a second one of the N optical oscillators.

10. The method of claim 9, wherein determining the corrected input signal based on the initial input signal comprises filtering the initial input signal.

11. The method of claim 10, wherein filtering the initial input signal comprises applying a notch filter to the initial input signal.

12. A system comprising:
an optical source apparatus comprising:
an optical oscillator configured to produce a pulse of light in response to an excitation signal; and
a spectral adjustment apparatus configured to control a spectral property of the pulse of light, wherein the optical oscillator is associated with a plurality of transfer functions, each transfer function being associated with a particular configuration of the spectral adjustment apparatus; and
a control system coupled to the optical source apparatus, the control system configured to:
determine a corrected excitation signal based on the transfer function associated with the particular configuration of the spectral adjustment apparatus used to produce the subsequent pulse of light, and
apply the corrected excitation signal to the optical source apparatus to adjust an energy of a subsequently produced pulse of light to account for a change in the configuration of the spectral adjustment apparatus.

13. The system of claim 12, wherein the optical source apparatus further comprises a power amplifier that receives a seed light beam from the optical oscillator, and the system is configured for use in a deep ultraviolet (DUV) lithography system.

14. The system of claim 12, wherein the spectral adjustment apparatus comprises at least one prism, and each transfer function is associated with a different position of the at least one prism.

15. A method comprising:
providing a first excitation signal to an optical oscillator associated with a spectral adjustment apparatus in a first configuration state to generate a first pulse of light having a first value of a spectral property;
adjusting the spectral adjustment apparatus to a second configuration state;
determining a corrected excitation signal based on an energy property of the first pulse of light and a transfer function of the optical oscillator when the spectral adjustment apparatus is in the second configuration state; and
providing the corrected excitation signal to the optical oscillator while the spectral adjustment apparatus is in the second configuration state to generate a second pulse of light having a second value of the spectral property.

16. A method of controlling an optical source apparatus to generate a pulsed light beam that has at least two spectral peaks separated by a spectral distance, the method comprising:
generating a first pulse of light from the optical source apparatus, the first pulse of light having a first wavelength and a first value of an energy property;
adjusting at least one component of the optical source apparatus from a first configuration state to a second configuration state, the at least one component being configured to control a spectral property of light emitted from the optical source apparatus;
determining a corrected excitation signal; and
applying the corrected excitation signal to the optical source apparatus after adjusting the at least one component from the first configuration state to the second configuration state to generate a second pulse of light from the optical source apparatus, the second pulse of light having a second wavelength and the first value of the energy property, wherein the pulsed light beam comprises at least the first pulse of light and the second pulse of light, the spectral distance is a difference between the first wavelength and the second wavelength, the optical source apparatus is associated with a plurality of transfer functions, each transfer function corresponds to a particular configuration state of the at least one component of the optical source apparatus, and the corrected excitation signal accounts for a variation between the transfer function associated with the first configuration state and the transfer function associated with the second configuration state.

17. The method of claim 16, wherein the optical source apparatus comprises only one optical oscillator, and adjusting the at least one component of the optical source apparatus comprises adjusting a spectral adjustment apparatus of the one optical oscillator from a first configuration state to a second configuration state;
the one optical oscillator is associated with the plurality of transfer functions, each of the transfer functions corresponding to a particular configuration state of the spectral adjustment apparatus; and
the corrected excitation signal is determined based on the transfer function that corresponds to the second configuration state of the spectral adjustment apparatus.

18. The method of claim 17, wherein adjusting the spectral adjustment apparatus comprises actuating a dispersive optical element.

19. A control module for an optical source apparatus, the control module configured to:
cause the optical source apparatus to generate a first pulse of light from the optical source apparatus, the first pulse of light having a first wavelength and a first value of an energy property;
adjust at least one component of the optical source apparatus from a first configuration state to a second configuration state, the at least one component being configured to control a spectral property of light emitted from the optical source apparatus;
determine a corrected excitation signal; and
apply the corrected excitation signal to the optical source apparatus after the at least one component is adjusted to generate a second pulse of light from the optical source apparatus, the second pulse of light having a second wavelength and the first value of the energy property, wherein the pulsed light beam comprises at least the first pulse of light and the second pulse of light, the spectral distance is a difference between the first wavelength and the second wavelength, the optical source apparatus is associated with a plurality of transfer functions, each transfer function corresponds to a configuration state of the at least one component, and the corrected excitation signal corrects for a difference between the transfer function corresponding to the first configuration state and the transfer function of the second configuration state.

20. The control module of claim 19, wherein the corrected excitation signal corrects for a difference between the transfer function corresponding to the first configuration state and the transfer function of the second configuration state, and causes the first pulse of light and the second pulse of light to have substantially the same energy.

* * * * *